US011201106B2

(12) United States Patent
Chen et al.

(10) Patent No.: US 11,201,106 B2
(45) Date of Patent: Dec. 14, 2021

(54) SEMICONDUCTOR DEVICE WITH CONDUCTORS EMBEDDED IN A SUBSTRATE

(71) Applicant: Taiwan Semiconductor Manufacturing Co., Ltd., Hsin-Chu (TW)

(72) Inventors: Hsin-Ping Chen, Hsinchu County (TW); Ming-Han Lee, Taipei (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/752,158

(22) Filed: Jan. 24, 2020

(65) Prior Publication Data
US 2021/0233834 A1  Jul. 29, 2021

(51) Int. Cl.
*H01L 23/48* (2006.01)
*H01L 23/522* (2006.01)
*H01L 29/78* (2006.01)
*H01L 21/768* (2006.01)
*H01L 21/8234* (2006.01)
*H01L 23/00* (2006.01)
*H01L 23/535* (2006.01)
*H01L 23/482* (2006.01)

(52) U.S. Cl.
CPC ...... *H01L 23/481* (2013.01); *H01L 21/76898* (2013.01); *H01L 21/823431* (2013.01); *H01L 23/4827* (2013.01); *H01L 23/5226* (2013.01); *H01L 23/535* (2013.01); *H01L 24/83* (2013.01); *H01L 29/785* (2013.01); *H01L 2224/83896* (2013.01)

(58) Field of Classification Search
CPC ....... H01L 21/76898; H01L 21/823431; H01L 23/481; H01L 23/4827; H01L 23/5226; H01L 23/535; H01L 24/83; H01L 2224/83896; H01L 29/785
See application file for complete search history.

(56) References Cited

U.S. PATENT DOCUMENTS

| 8,772,109 | B2 | 7/2014 | Colinge |
| 8,785,285 | B2 | 7/2014 | Tsai et al. |
| 8,802,504 | B1 | 8/2014 | Hou et al. |
| 8,803,292 | B2 | 8/2014 | Chen et al. |
| 8,803,316 | B2 | 8/2014 | Lin et al. |
| 8,816,444 | B2 | 8/2014 | Wann et al. |
| 8,823,065 | B2 | 9/2014 | Wang et al. |

(Continued)

OTHER PUBLICATIONS

Michallet, Jean-Eric, et al. "CoolCube: A True 3DVLSI Alternative to Scaling", Mar. 24, 2015, 3DInCities. https://www.3dincites.com/2015/03/coolcube-a-true-3dvlsi-alternative-to-scaling/.

*Primary Examiner* — Herve-Louis Y Assouman
(74) *Attorney, Agent, or Firm* — Haynes and Boone, LLP

(57) ABSTRACT

A structure includes a first substrate having a front side and a back side and a second substrate having a front side and a back side, wherein the back side of the second substrate is attached to the back side of the first substrate. The structure further includes a device layer over the front side of the second substrate; a first conductor going through a semiconductor layer in the second substrate; and a conductive connection that connects the first conductor to a conductive feature in the device layer.

20 Claims, 19 Drawing Sheets

(56) References Cited

U.S. PATENT DOCUMENTS

| | | |
|---|---|---|
| 8,860,148 B2 | 10/2014 | Hu et al. |
| 8,993,380 B2 | 3/2015 | Hou et al. |
| 9,105,490 B2 | 8/2015 | Wang et al. |
| 9,236,267 B2 | 1/2016 | De et al. |
| 9,236,300 B2 | 1/2016 | Liaw |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 9,520,482 B1 | 12/2016 | Chang et al. |
| 9,576,814 B2 | 2/2017 | Wu et al. |
| 9,704,835 B2 | 7/2017 | Feng et al. |
| 9,711,555 B2 | 7/2017 | Lin et al. |
| 10,355,019 B1* | 7/2019 | Li ............... H01L 27/1225 |
| 2009/0283871 A1* | 11/2009 | Chang ............ H01L 24/13 257/621 |
| 2011/0241082 A1* | 10/2011 | Bernstein ....... H01L 23/522 257/255 |
| 2012/0187530 A1* | 7/2012 | Zhang ......... H01L 21/76898 257/531 |

* cited by examiner

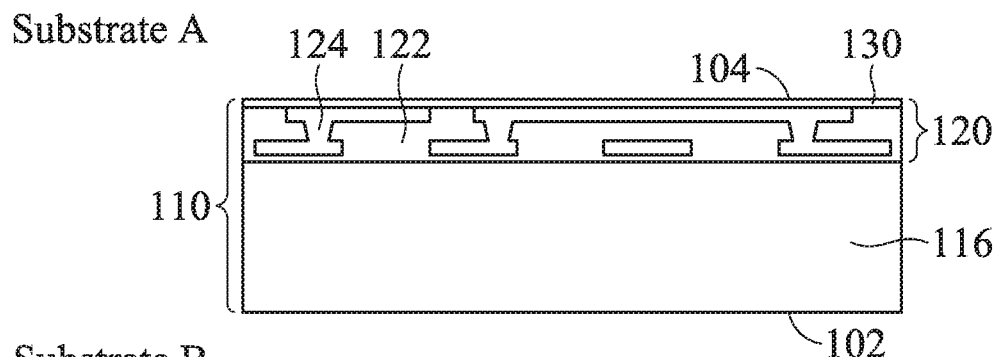
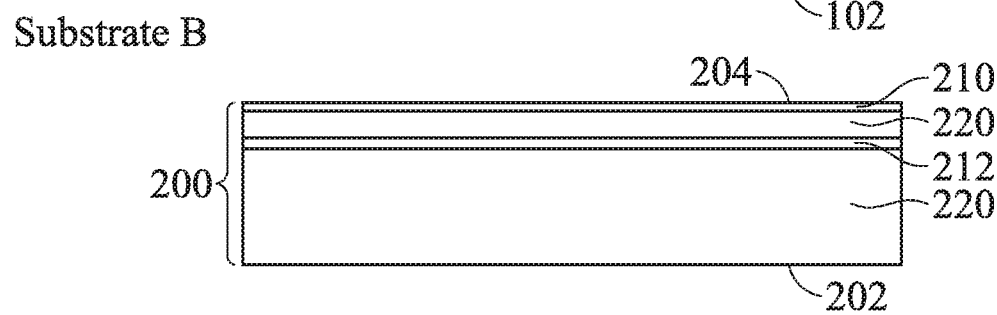
FIG. 10a
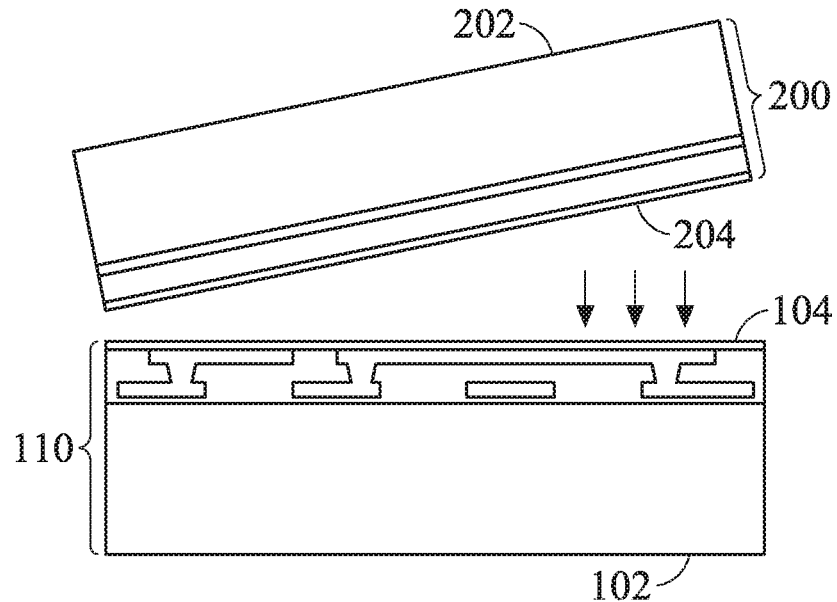
FIG. 10b
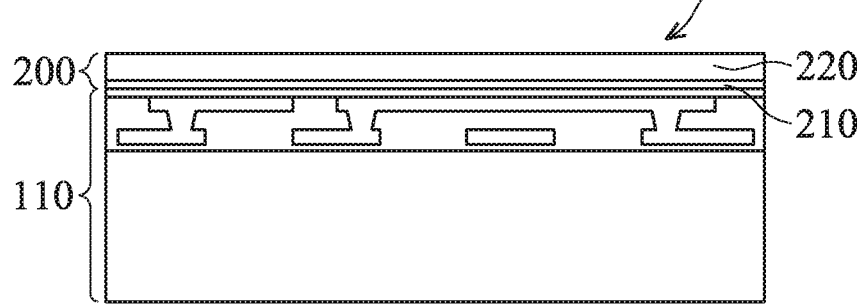
FIG. 10c

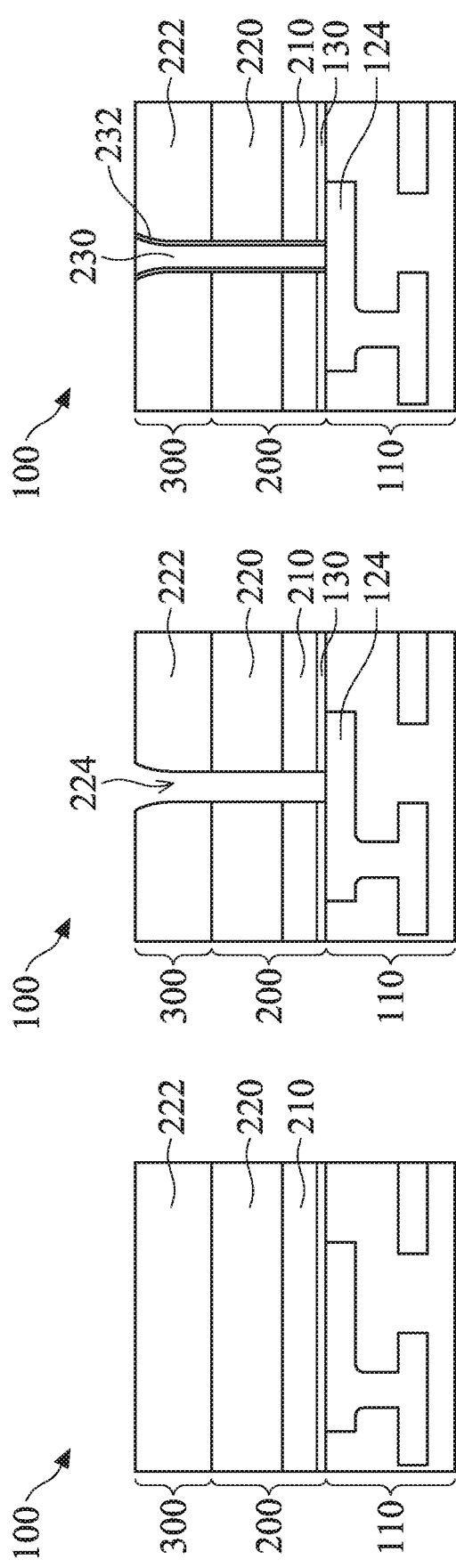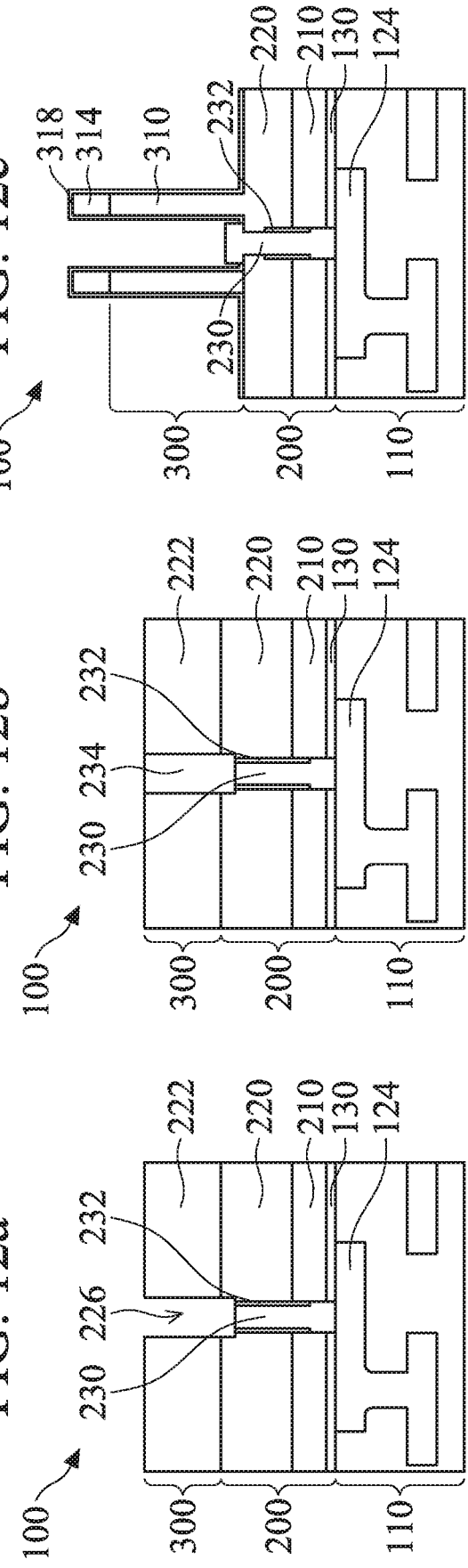

SEMICONDUCTOR DEVICE WITH CONDUCTORS EMBEDDED IN A SUBSTRATE

BACKGROUND

Conventionally, an integrated circuit is built in a stacked-up fashion, having transistors at the lowest level and interconnect (vias and wires) on top of the transistors to provide connectivity to the transistors. Power rails (e.g., metal lines for voltage sources and ground planes) are also above the transistors and may be part of the interconnect. As the integrated circuits continue to scale down, so do the power rails. This inevitably leads to increased voltage drop across the power rails, as well as increased power consumption of the integrated circuits.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 10a, 10b, and 10c illustrate cross-sectional views of a semiconductor device during fabrication according to an embodiment of the method shown in FIG. 9.

FIGS. 12a, 12b, 12c, 12d, 12e, and 12f illustrate cross-sectional views of a semiconductor device during fabrication according to an embodiment of the method shown in FIG. 11.

DETAILED DESCRIPTION

Figure 1:
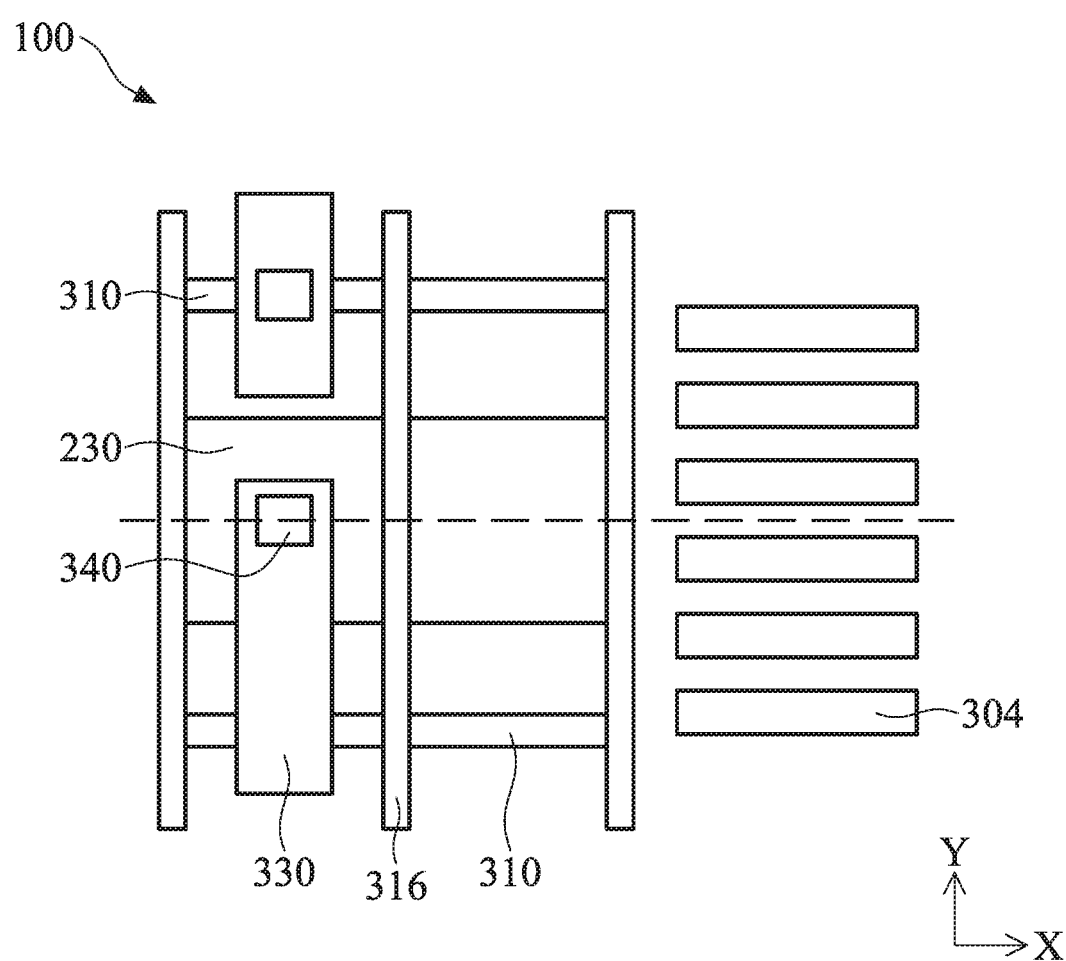
FIG. 1 illustrates a top view of a semiconductor device in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within ±10% of the number described, unless otherwise specified. For example, the term "about 5 nm" encompasses the dimension range from 4.5 nm to 5.5 nm.

Various embodiments of the present disclosure relate generally to integration of semiconductor devices, and more particularly to a semiconductor device with conductors through a substrate. These conductors are below or at the same level as transistors of the semiconductor device. Thus, they are also referred to as "embedded conductors" in some instances in the present disclosure. These conductors complement existing multilayer interconnect and provide extra routing resources to the semiconductor device. For example, they may be used as power rails or other type of interconnect (such as signal lines) for the semiconductor device. Particularly, they are built with large dimensions to reduce voltage drop and power consumption. In the following description, specific embodiments are provided as examples to teach the broader inventive concept, and one of ordinary skill in the art can easily apply the teaching of the present disclosure to other semiconductor devices and methods of making thereof.

FIG. 1 illustrates a top view of a part of a semiconductor device 100 according to various aspects of the present disclosure. The semiconductor device 100 includes an embedded conductor 230 that is adjacent to active regions 310 where source, drain, and channel of various transistors are formed therein or thereon. In the present embodiment, the embedded conductor 230 and the active regions 310 are oriented lengthwise along the same direction X. The embedded conductor 230 is wider than the active region 310 along the direction Y that is perpendicular to the direction X. The semiconductor device 100 further includes gate lines 316 that overlap with the active regions 310 and provide gate electrodes (or terminals) for the transistors. The gate lines 316 are oriented lengthwise along the direction Y. In the present embodiment, the active regions 310 are fin active regions, i.e., having fin-like shape, and the transistors are FinFETs. In alternative embodiments, the active regions 310 may be planar active regions, nano-sheet active regions, or nano-wire active regions. The semiconductor device 100 further includes local interconnect 330 and 340 that connect the embedded conductor 230 to some conductive features (e.g., source, drain, and/or gate electrodes) of the transistors. The local interconnect 330 is oriented lengthwise along the direction Y. The local interconnect 340 is oriented lengthwise along the direction Z (see FIG. 2) that is perpendicular to the directions X and Y (i.e., going in and out of the page of FIG. 1). The semiconductor device 100 further includes a multilayer interconnect 304 that provides wires and vias (or via plugs) for routing signals and/or the power rails (voltage source and ground) of the semiconductor device 100. The spatial relationship of the various components above, as well as other components of the semiconductor device 100 are further illustrated in FIG. 2.

Figure 2:
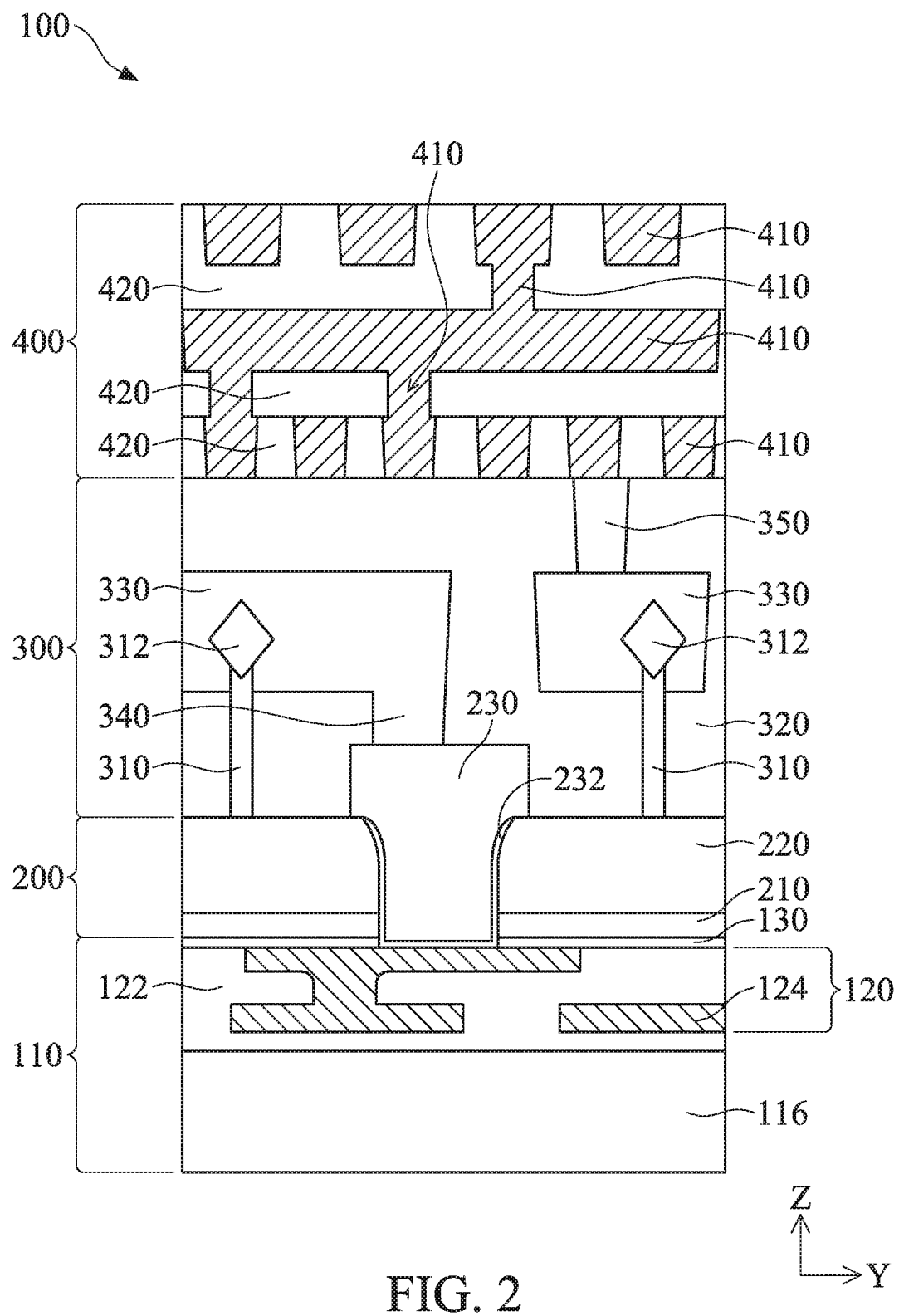
FIGS. 2, 3, 4, and 5 illustrate cross-sectional views of a semiconductor device in accordance with various embodiments of the present disclosure.

Referring to FIG. 2 which shows a cross-sectional view of a part of the semiconductor device 100 in the Y-Z plane, the semiconductor device 100 includes a first substrate 110 and a second substrate 200 that are attached together. The substrate 110 has a front side (where a layer 116 of a semiconductor material is located) and a back side (where a redistribution layer 120 and an insulator 130 are located). The substrate 200 has a front side (where a layer 220 of a semiconductor material is located) and a back side (where an insulator 210 is located). In the present embodiment, the back side of the substrate 110 is attached to the back side of the substrate 200, for example, through a bonding mechanism (such as a direct bond or a hybrid bond), using an adhesive, or using other attachment mechanisms.

The semiconductor device 100 includes embedded conductors 230, with one shown in FIG. 2. In this embodiment, the embedded conductor 230 starts from the back side of the substrate 110, goes completely through the substrate 200, and extends above the front side of the substrate 200. In another embodiment, the embedded conductor 230 penetrates through the substrate 200 but does not arise above the substrate 200 (i.e., its top surface is at the same level as the front side of the substrate 200). In yet another embodiment, the embedded conductor 230 does not penetrate the substrate 200, i.e., its top surface is below the top surface of the substrate 200. To further this embodiment, the local interconnect 340 extends into the substrate 200 to contact the embedded conductor 230. The conductive material(s) used for the embedded conductors 230 may vary depending on the order of fabrication between forming the embedded conductors 230 and any high temperature fabrication stages. For example, fabrication stages such as well formation and source/drain formation may involve high temperature annealing at a few hundred degrees Celsius or over 1,000 degrees Celsius. In some embodiments where the embedded conductors 230 are formed before such high temperature processes are performed, the materials used for the embedded conductors 230 are selected to withstand such high temperature. Thus, materials with high melting point and low resistivity are suitable for the embedded conductors 230. These suitable materials may include tungsten, ruthenium, rhodium, iridium, molybdenum, chromium, or a combination thereof. In some embodiments where the embedded conductors 230 are formed after such high temperature processes are performed or where the fabrication processes do not involve high temperature at all, other conductive materials can also be used in addition to the above listed material. For example, copper, gold, silver, palladium, osmium, platinum, tungsten, ruthenium, rhodium, iridium, molybdenum, chromium, other materials, or a combination thereof may be used as the material(s) for the embedded conductors 230 in these embodiments. The embedded conductor 230 may include other suitable conductive material(s).

In the present embodiment, the semiconductor device 100 includes a liner 232 between the embedded conductor 230 and the substrates 110 and 200. The liner 232 may also interpose between the embedded conductor 230 and a dielectric material 320 over the front side of the substrate 200 in some embodiment. The liner 232 is optional in some embodiments. The inclusion of the liner 232 and the material thereof depend on the material of the embedded conductor 230. For example, when the material of the embedded conductor 230 is relatively active (such as copper), then the liner 232 having an oxide or a nitride is included as a barrier layer to prevent the metal material in the embedded conductor 230 from diffusing into the surrounding silicon or dielectric material. On the other hand, when the material of the embedded conductor 230 is relatively inactive, the liner 232 may be omitted. When the liner 232 interposes between the embedded conductor 230 and conductors 124 (as shown in this embodiment), the liner 232 uses a conductive material, such as conductive titanium nitride. Otherwise, the liner 232 can be conductive or non-conductive.

Each of the semiconductor layers 116 and 220 may comprise silicon or other suitable semiconductor material(s), such as germanium, silicon carbide, gallium arsenide, gallium phosphide, indium phosphide, indium arsenide, indium antimonide, silicon germanium, gallium arsenide phosphide, aluminum indium phosphide, aluminum gallium arsenide, gallium indium arsenide, gallium indium phosphide, or gallium indium arsenide phosphide. The semiconductor layers 116 and 220 may comprise same or different materials.

Although not shown, the semiconductor layer 116 may include active devices such as transistors including metal-oxide-silicon field effect transistors (MOSFETs), FinFETs, gate-all-around (GAA) devices, nano-wire devices, nano-sheet devices, high frequency transistors, high voltage transistors, high power transistors, low power transistors, or other type of active devices. The semiconductor layer 116 may also include passive devices such as inductors, capacitors, and resistors, and may also include isolation structures, metal wires, and other structures.

The redistribution layer 120 includes conductors 124 embedded in one or more dielectric layers 122. Again, the material(s) used for the conductors 124 may vary depending on the order of fabrication between forming the conductors 124 and any high temperature fabrication stages, similar to what is discussed above with respect to the embedded conductors 230. In some embodiments where the conductors 124 are formed before such high temperature processes are performed, the materials used for the conductors 124 are selected to withstand high temperature, such as tungsten, ruthenium, rhodium, iridium, molybdenum, chromium, or a combination thereof. In some embodiments where the conductors 124 are formed after such high temperature processes are performed or where the fabrication processes do not involve high temperature at all, other conductive materials can also be used in addition to the above listed material. For example, copper, gold, silver, aluminum, palladium, osmium, platinum, tungsten, ruthenium, rhodium, iridium, molybdenum, chromium, other materials, or a combination thereof may be used as the material(s) for the conductors 124 in these embodiments. The dielectric layers 122 may comprise an oxide material, such as silicon dioxide. The embedded conductors 230 electrically contact some of the conductors 124, either directly or indirectly through the liner 232. In an embodiment, the redistribution layer 120 provides electrical connections to package pads (as will be shown in FIG. 5 for example), some of which are voltage sources or grounds for the device 100. To further this embodiment, some of the embedded conductors 230 are power rails or ground planes for the device 100 and are connected to the power or ground package pads. Due to the large size of the embedded conductors 230 and the conductors 124, the device 100 has the advantage of low voltage drop on its power rails and ground planes. In various embodiments, the embedded conductors 230 may be used for routing other signals in addition to or instead of power rails or ground planes.

Over the redistribution layer 120 is the insulator 130. The insulator 130 may comprise oxide such as silicon dioxide or nitride such as silicon nitride ($Si_3N_4$). At the back side of the substrate 200, the insulator 210 may comprise oxide such as silicon dioxide.

Over the front side of the substrate 200, there is a device layer 300 which includes semiconductor active regions (such as semiconductor fins), and various active devices (e.g., transistors) built in or on the semiconductor active regions. The device layer 300 may also include passive devices such as capacitors, resistors, and inductors. The device layer 300 further includes local interconnects, isolation structures, and other structures. In the embodiment shown in FIG. 2, the device layer 300 includes semiconductor fins 310 that extend upwardly from the substrate 200, epitaxial features 312 over the semiconductor fins 310, and dielectric isolation features 320 between the semiconductor active regions including the semiconductor fins 310. The epitaxial feature 312 may be source or drain electrodes of transistors. The semiconductor fins 310 may include silicon or other suitable semiconductor materials such as silicon germanium. Top surface of the semiconductor fins 310 is above top surface of the embedded conductor 230. The device layer 300 also includes local interconnects 330 and 340 that provide connectivity to the source and/or drain electrodes of the transistors, as well as gate electrodes though not shown in this figure (but see gate electrodes 316 in FIG. 1). Particularly, some of the local interconnects 330 and 340 connect some of the source, drain, or gate electrodes to the embedded conductor(s) 230. The local interconnect 340 extends in the direction Z that is generally perpendicular to the upper surface of the substrate 200, while the local interconnect 330 extends in a direction generally parallel to the upper surface of the substrate 200. The device layer 300 further includes contact plugs 350 that connect the source, drain, and gate electrodes of the transistors to a multilayer interconnect 400. The contact plugs 350 may comprise copper, tungsten, ruthenium, or other suitable materials.

The multilayer interconnect 400 is over the device layer 300 and includes conductors 410 (such as wires and vias) embedded in one or more dielectric materials 420. The conductors 410 provide connectivity to the source, drain, and gate electrodes of the transistors in the device layer 300. The conductors 410 may also provide power rails and ground planes for the device 100. But generally, the size of the conductors 410 is much smaller than the embedded conductor 230. The conductors 410 may comprise copper, aluminum, or other suitable materials, and may be formed using single damascene process, dual damascene process, or other suitable processes. The dielectric materials 420 may comprise silicon nitride, silicon oxynitride, silicon nitride with oxygen (O) or carbon (C) elements, tetraethylorthosilicate (TEOS) oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials.

Figure 3:
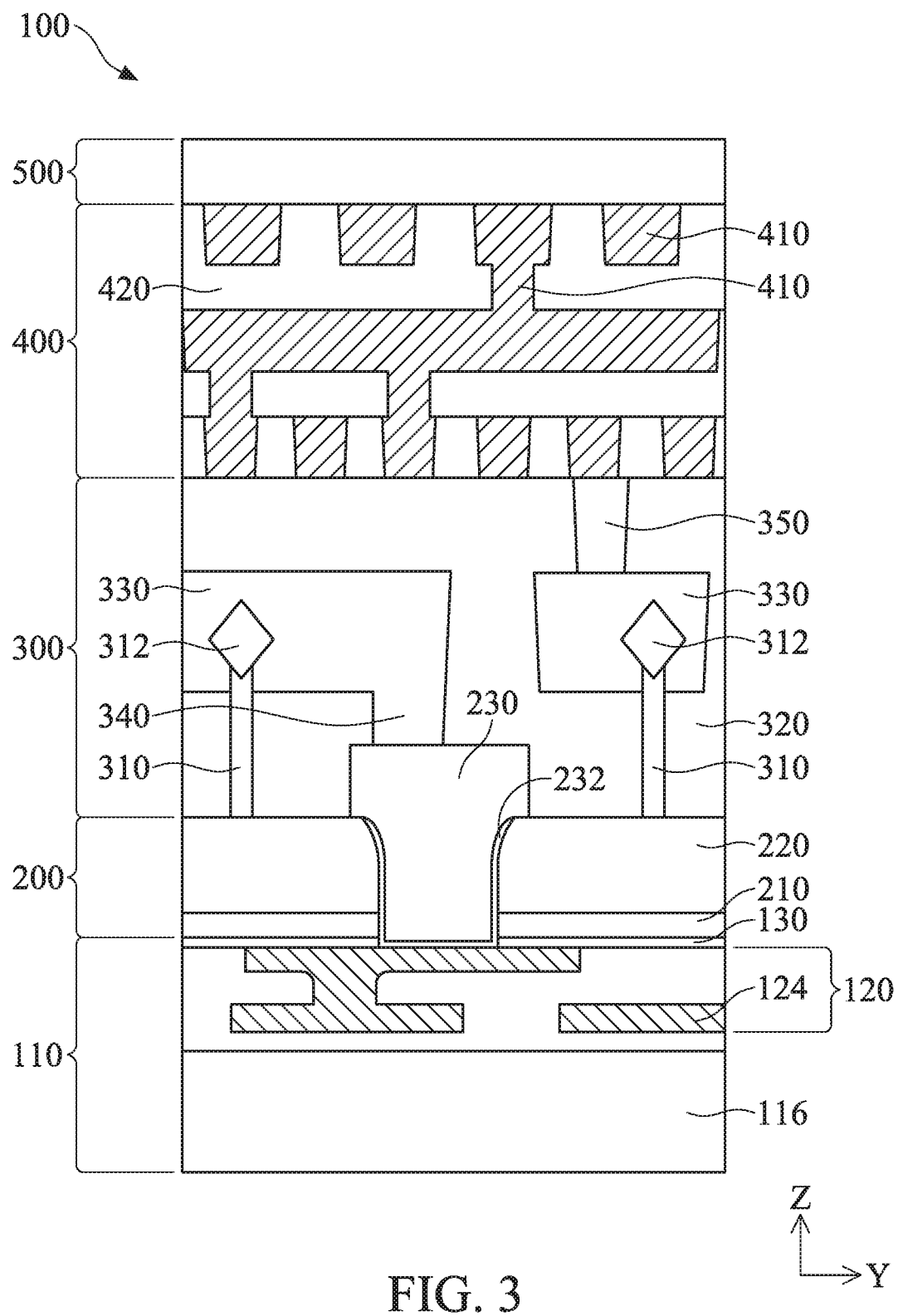

FIG. 3 shows a cross-sectional view of a part of the semiconductor device 100 in accordance with an embodiment. The semiconductor device 100 includes the substrates 110 and 200, the device layer 300, and the multilayer interconnect 400. These structures have been described with reference to FIG. 2, thus detailed description of them is omitted herein for brevity. The semiconductor device 100 further includes a metallization layer (or package layer) 500 over the multilayer interconnect 400. In an embodiment, the metallization layer 500 includes pads for connecting inputs, outputs, power, ground, and other interface signals of the semiconductor device 100 to package pins. Some of these pads are electrically connected to the transistors in the device layer 300 through the multilayer interconnect 400, the plugs 350, and/or other connectors. Some of these pads are electrically connected to the embedded conductors 230 through the multilayer interconnect 400, the plugs 350, the local interconnect 333 and 340, and/or other connectors. The metallization layer 500 may also include power rails, ground planes, passivation, and other suitable features.

Figure 4:
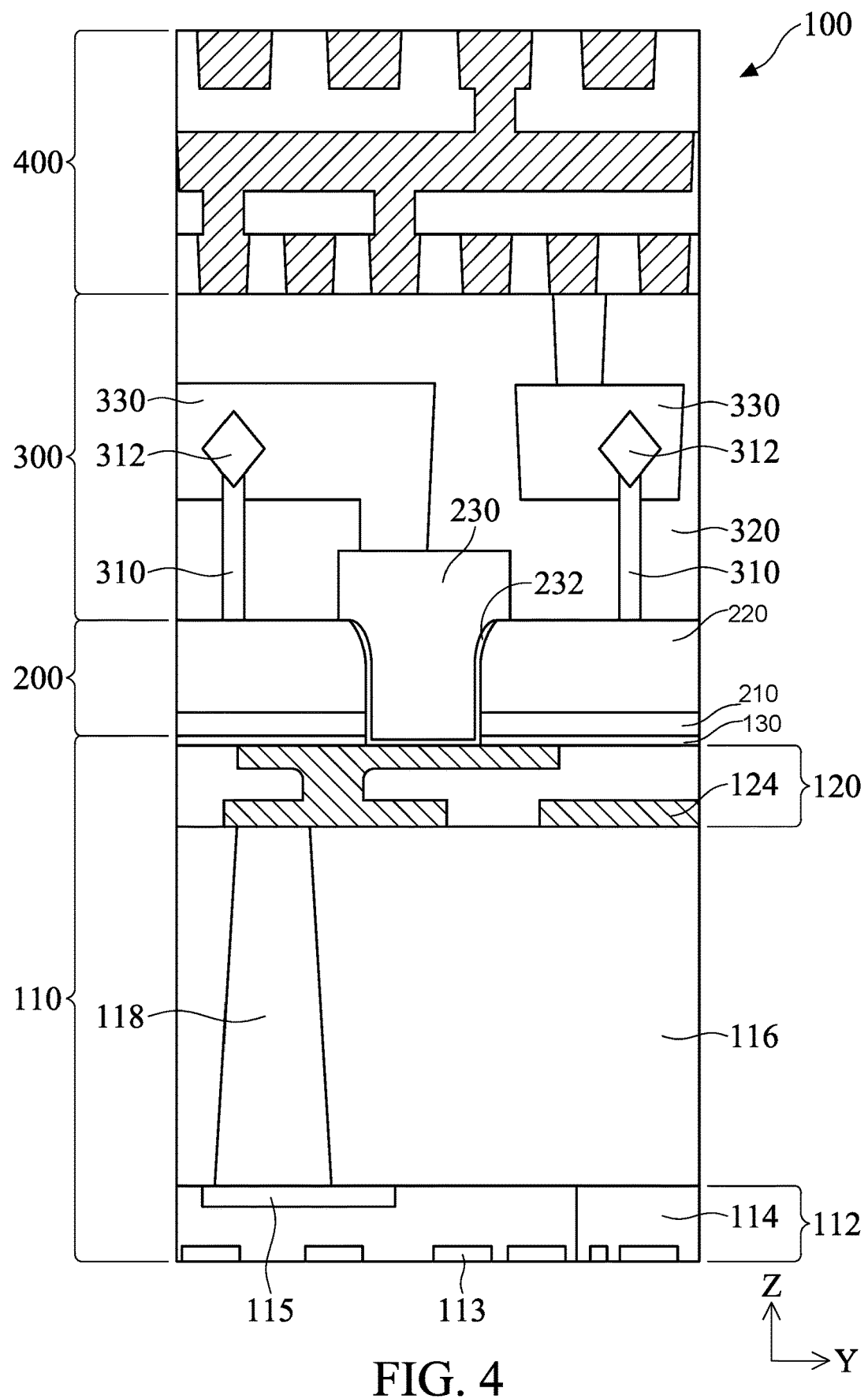

FIG. 4 shows a cross-sectional view of a part of the semiconductor device 100 in accordance with another embodiment. The semiconductor device 100 includes the substrates 110 and 200, the device layer 300, and the multilayer interconnect 400. These structures have been described with reference to FIG. 2, thus detailed description of them is omitted herein for brevity. The semiconductor device 100 further includes a redistribution layer 112 over the front side of the substrate 110. In the present embodiment, the redistribution layer 112 includes pads 113 for connecting to package pins of the device 100, one or more dielectric layers 114, and conductors 115 (one illustrated) embedded in the dielectric layers 114. In this embodiment, the substrate 110 further includes through-silicon vias (TSVs) 118 that go through the semiconductor layer 116 and electrically connect some of the conductors 124 in the redistribution layer 120 to some of the conductors 115 in the redistribution layer 112. Each of the conductors 124 and 115 has a larger footprint than the TSV 118. The redistribution layer 112, the TSV 118, and the redistribution layer 120 provide electrical connections from the package pins to the embedded conductors 230, which in turn provide electrical connections to the transistors in the device layer 300.

Figure 5:
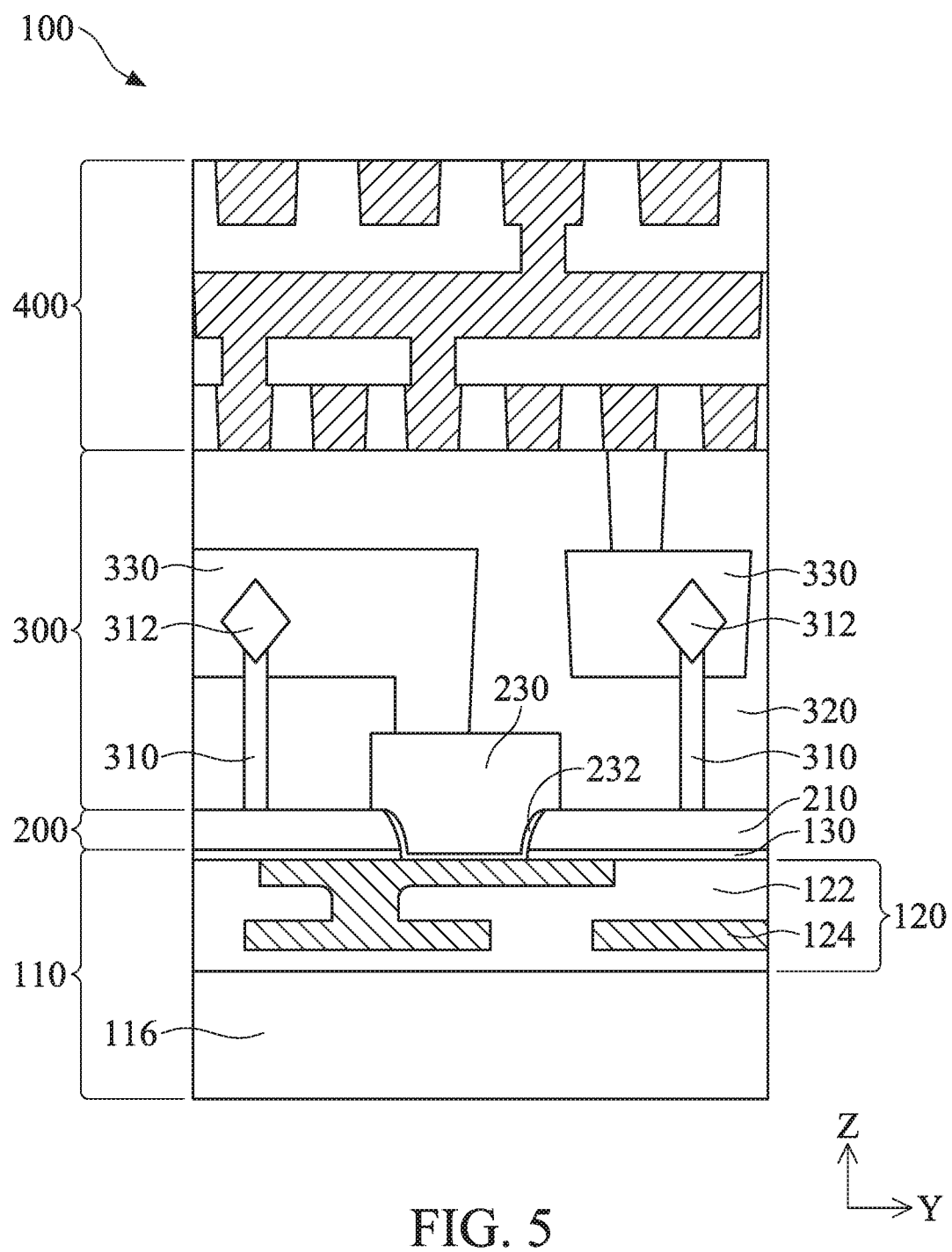

FIG. 5 shows a cross-sectional view of a part of the semiconductor device 100 in accordance with yet another embodiment. The semiconductor device 100 includes the substrates 110 and 200, the device layer 300, and the multilayer interconnect 400. The substrate 110, the device layer 300, and the multilayer interconnect 400 have been described with reference to FIG. 2, thus detailed description of them is omitted herein for brevity. The substrate 200 in this embodiment is a variant of the substrate 200 in the embodiment shown in FIG. 2. Particularly, the substrate 200 in this embodiment includes the insulator 210 extending from the front side of the substrate 200 to the back side of the substrate 200 and does not include the semiconductor layer 220. The insulator 210 may include one or more layers of insulating materials such as silicon dioxide. The semiconductor fins 310 are built directly on the upper surface of the insulator 210. Effectively, the semiconductor layer from which the semiconductor fins 310 are created and the insulator 210 may collectively be a part of a silicon-oninsulator (SOI) substrate. In contrast, in FIG. 2, the semiconductor layer from which the semiconductor fins 310 are created and the semiconductor layer 220 may collectively be a part of a bulk silicon substrate. Notably, the thickness of the substrate 200 in FIG. 2 is greater than the thickness of the substrate 200 in FIG. 5. Another difference between this embodiment and the one shown in FIG. 2 is the aspect ratio of the embedded conductor 230, which is defined as the ratio of the height to the width of the embedded conductor 230. The aspect ratio of the embedded conductor 230 is greater in the embodiment in FIG. 2 than in the embodiment in FIG. 5.

Figure 6:
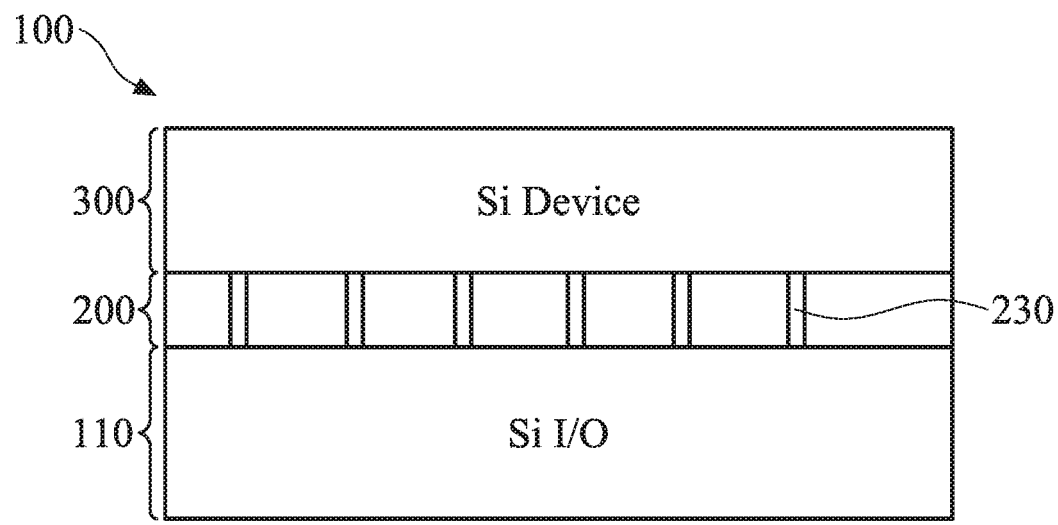
FIGS. 6, 7, and 8 illustrate cross-sectional views of a semiconductor device in accordance with various embodiments of the present disclosure.
Figure 7:
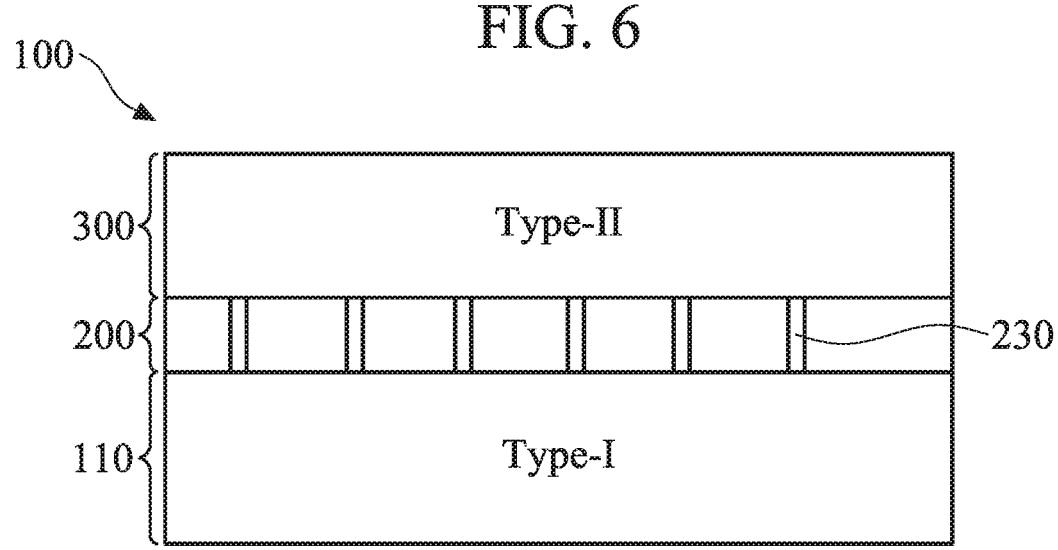
Figure 8:
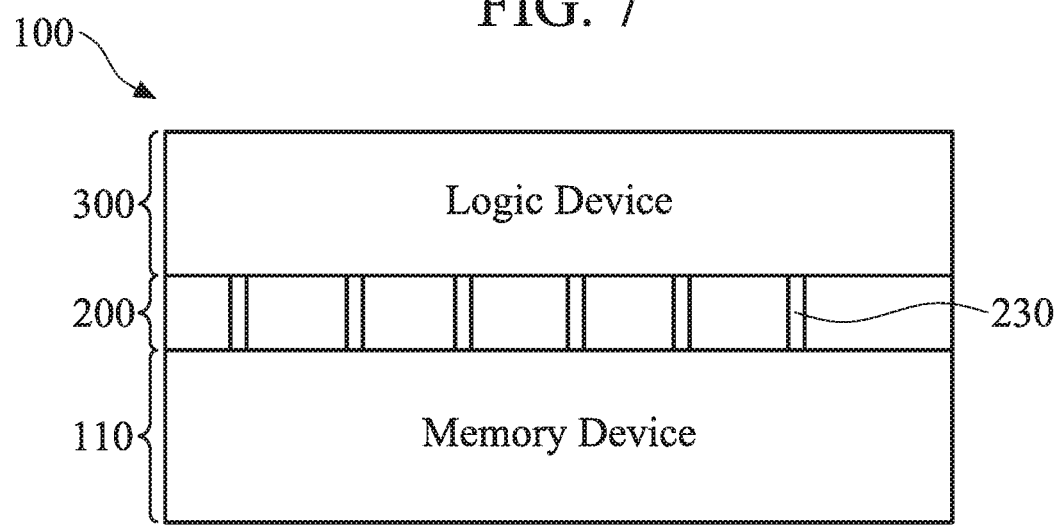

FIGS. 6, 7, and 8 illustrate various embodiments of the semiconductor device 100. Referring to FIG. 6, the semiconductor device 100 includes the substrates 110 and 200, and the device layer 300. The semiconductor device 100 may include other components or layers such as the multilayer interconnect 400, the metallization layer 500, or the redistribution layer 112. The embedded conductors 230 go through the substrate 200 and connect conductive features (not shown) in the substrate 110 to conductive features (not shown) in the device layer 300. The substrate 200 may take the form as in FIG. 2 (i.e., having a semiconductor layer 220 over an insulator 210) or the form as in FIG. 5 (i.e., having the insulator 210 without the semiconductor layer 220). The embedded conductors 230 may rise above the top surface of the substrate 200. In another embodiment, the top surface of the embedded conductors 230 may be even with the top surface of the substrate 200. In yet another embodiment, the top surface of the embedded conductors 230 may be lower than the top surface of the substrate 200. The substrate 110 may include the redistribution layer 120 at its back side such as shown in FIGS. 2-5. Particularly, the substrate 110 includes input/output (I/O) devices for the device 100, while the device layer 300 includes core devices (including logic devices and memory devices) for the device 100. The embedded conductors 230 provide connection between the I/O devices and the core devices. The substrate 200 provides reasonable isolation (for example, for shielding noises) between the I/O devices and the core devices. In some applications where, high drive current is desirable, the embedded conductors 230 enable such high drive current with relatively low IR drop and power consumption. The embodiment in FIG. 6 provides flexible design for integrating multiple devices. Particularly, the device layer 300 may provide transistors with high density, while the substrate 110 may provide transistors in large sizes for I/O functions. The transistors in the device layer 300 and in the substrate 110 may have different feature sizes or be produced by different processes. This gives designers latitude to optimize each type of devices (I/O devices or core devices) separately.

Referring to FIG. 7, the semiconductor device 100 includes the substrates 110 and 200, the device layer 300, and the embedded conductors 230. The semiconductor device 100 may include other components or layers such as the multilayer interconnect 400, the metallization layer 500, or the redistribution layer 112. The embodiment of the device 100 in this figure is substantially the same as that in FIG. 6. Thus, many details of this embodiment are omitted for brevity. Still referring to FIG. 7, the substrate 110 includes a semiconductor material doped with a first type of dopant, the device layer 300 includes a semiconductor material doped with a second type of dopant, where the first and second types of dopants have opposite conductivity (e.g., one is N-type and the other is P-type). With reference to FIG. 2, the doped semiconductor material of the substrate 110 may include the semiconductor layer 116, and the doped semiconductor material of the device layer 300 may include the semiconductor fins 310. In an embodiment, the substrate 110 includes an N-type doped semiconductor material (i.e., doped with an N type dopant such as phosphorus or arsenic); and the device layer 300 includes a P-type doped semiconductor material (i.e., doped with a P type dopant such as boron or indium). In another embodiment, the substrate 110 includes a P-type doped semiconductor material (i.e., doped with a P type dopant such as boron or indium); and the device layer 300 includes an N-type doped semiconductor material (i.e., doped with an N type dopant such as phosphorus or arsenic). In an embodiment, the semiconductor material in the substrate 110 is the same as the semiconductor material in the device layer 300 (for example, both are silicon), aside from the difference in the dopants therein. In another embodiment, the semiconductor material in the substrate 110 is different from the semiconductor material in the device layer 300, for example, one is primarily silicon and the other is primarily silicon germanium. The embodiment in FIG. 7 provides flexible design for integrating multiple devices. Particularly, because there is only one type of dopant in the substrate 110 (or in the device layer 300), the manufacturing process for the substrate 110 (or for the device layer 300) is simplified than other designs where different types of dopants are needed in a single substrate (such as creating N-wells in a P-type substrate).

Referring to FIG. 8, the semiconductor device 100 includes the substrates 110 and 200, the device layer 300, and the embedded conductors 230. The semiconductor device 100 may include other components or layers such as the multilayer interconnect 400, the metallization layer 500, or the redistribution layer 112. The embodiment of the device 100 in this figure is substantially the same as that in FIG. 6. Thus, many details of this embodiment are omitted for brevity. Still referring to FIG. 8, in the present embodiment, the substrate 110 includes memory devices and the device layer 300 includes logic devices. In another embodiment, the substrate 110 includes logic devices, and the device layer 300 includes memory devices. Each of the logic devices and the memory devices may comprise FinFET or other type of transistors. The embodiment in FIG. 8 provides flexible design for integrating multiple devices. Particularly, logic devices and memory devices may have different optimization targets. For example, logic devices may be optimized for speed, and memory devices are usually optimized for circuit density and/or low power. Thus, logic devices and memory devices may have different feature sizes. And placing both types of devices onto one substrate is sometimes suboptimal. With the embodiment shown in FIG. 8, the substrate 110 and the device layer 300 can each be optimized independently, and the embedded conductors 230 provide needed connections between the logic devices and the memory devices.

FIGS. 9, 11, 13, 15, and 17 illustrate flow charts of methods 900, 1100, 1300, 1500, and 1700 for making the semiconductor device 100 in various embodiments discussed above. The methods 900, 1100, 1300, 1500, and 1700 are merely examples, and are not intended to limit the present disclosure beyond what is explicitly recited in the claims. Additional operations can be provided before, during, and after the methods 900, 1100, 1300, 1500, and 1700, and some operations described can be replaced, eliminated, or relocated for additional embodiments of the methods. The method 900 is described below in conjunction with FIGS. 10a, 10b, and 10c. The method 1100 is described below in conjunction with FIGS. 12a, 12b, 12c, 12d, 12e, and 12f. The method 1300 is described below in conjunction with FIGS. 14a, 14b, 14c, and 14d. The method 1500 is described below in conjunction with FIGS. 16a, 16b, 16c, 16d, 16e, 16f, and 16g. The method 1700 is described below in conjunction with FIGS. 18a, 18b, 18c, 18d, 18e, 18f, and 18g. FIGS. 10a-c, 12a-f, 14a-d, 16a-g, and 18a-g illustrate various cross-sectional views of the semiconductor device 100 during fabrication steps according to the methods.

Figure 9:
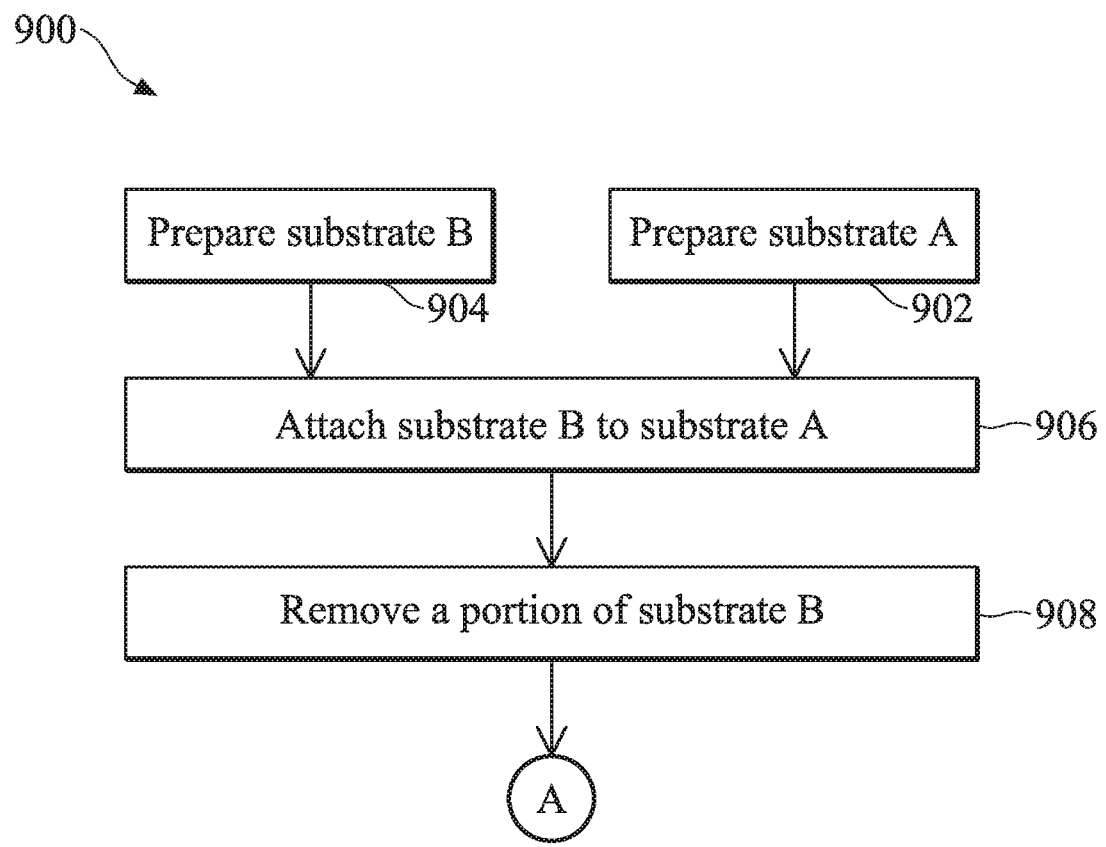
FIG. 9 illustrates a flow chart of a method for making a semiconductor device in accordance with an embodiment of the present disclosure.

Referring to FIG. 9, at operation 902, the method 900 prepares a substrate A to be included in the semiconductor device 100. For example, the substrate A may be an embodiment of the substrate 110 as shown in FIGS. 2-8. The following description refers to substrate A also as the substrate 110. Referring to FIG. 10a, the substrate 110 has a front side (pointed to by the reference 102) and a back side (pointed to by the reference 104). A semiconductor layer 116 is located at the front side of the substrate 110. A redistribution layer 120 and an insulator 130 are located at the back side of the substrate 110. The semiconductor layer 116 may be a silicon wafer in an embodiment. The redistribution layer 120 may be formed by depositing one or more dielectric layers 122 over the surface of the semiconductor layer 116, etching the dielectric layers 122 to form trenches, and forming the conductors 124 in the trenches. The insulator 130 (such as an oxide or a nitride) is deposited over the redistribution layer 120 using any suitable methods such as chemical vapor deposition (CVD). The insulator 130 is also referred to as passivation layer 130.

At operation 904, the method 900 prepares a substrate B to be included in the semiconductor device 100. For example, the substrate B may be an embodiment of the substrate 200 as shown in FIGS. 2-8. The following description refers to substrate B also as the substrate 200. Referring to FIG. 10a, the substrate 200 has a front side (pointed to by the reference 202) and a back side (pointed to by the reference 204). A semiconductor layer 220 is located at the front side of the substrate 200. The semiconductor layer 220 may be a silicon wafer in an embodiment. An insulator 210 (such as an oxide) is located at the back side of the substrate 200. The insulator 210 may be formed by oxidizing the surface of the semiconductor layer 220 using thermal oxidation or other type of oxidation. In the present embodiment, the substrate 200 further includes a hydrogen-rich layer (or zone) 212, which may be formed by implanting hydrogen into the semiconductor layer 220.

At operation 906, the method 900 (FIG. 9) attaches the substrates A and B together. Referring to FIG. 10b, in the present embodiment, the method 900 flips substrate B upside down and bonds the back side of the substrate B to the back side of the substrate A. The operation 906 may use any suitable bonding processes, such as direct bonding or hybrid bonding. The operation 906 may include rinsing, alignment, and/or other processes.

At operation 908, the method 900 (FIG. 9) removes a portion of the substrate B. Referring to FIG. 10c, in the present embodiment, the method 900 performs an annealing process which causes the hydrogen-rich zone 212 to create voids, thereby breaking off a portion of the semiconductor layer 220. The portion of the semiconductor layer 220 between the hydrogen-rich zone 212 and the insulator 210 remains in the device 100 and becomes the front side of the substrate 200. In alternative embodiments, the portion of the substrate B may be removed by grinding or other methods.

Figure 11:
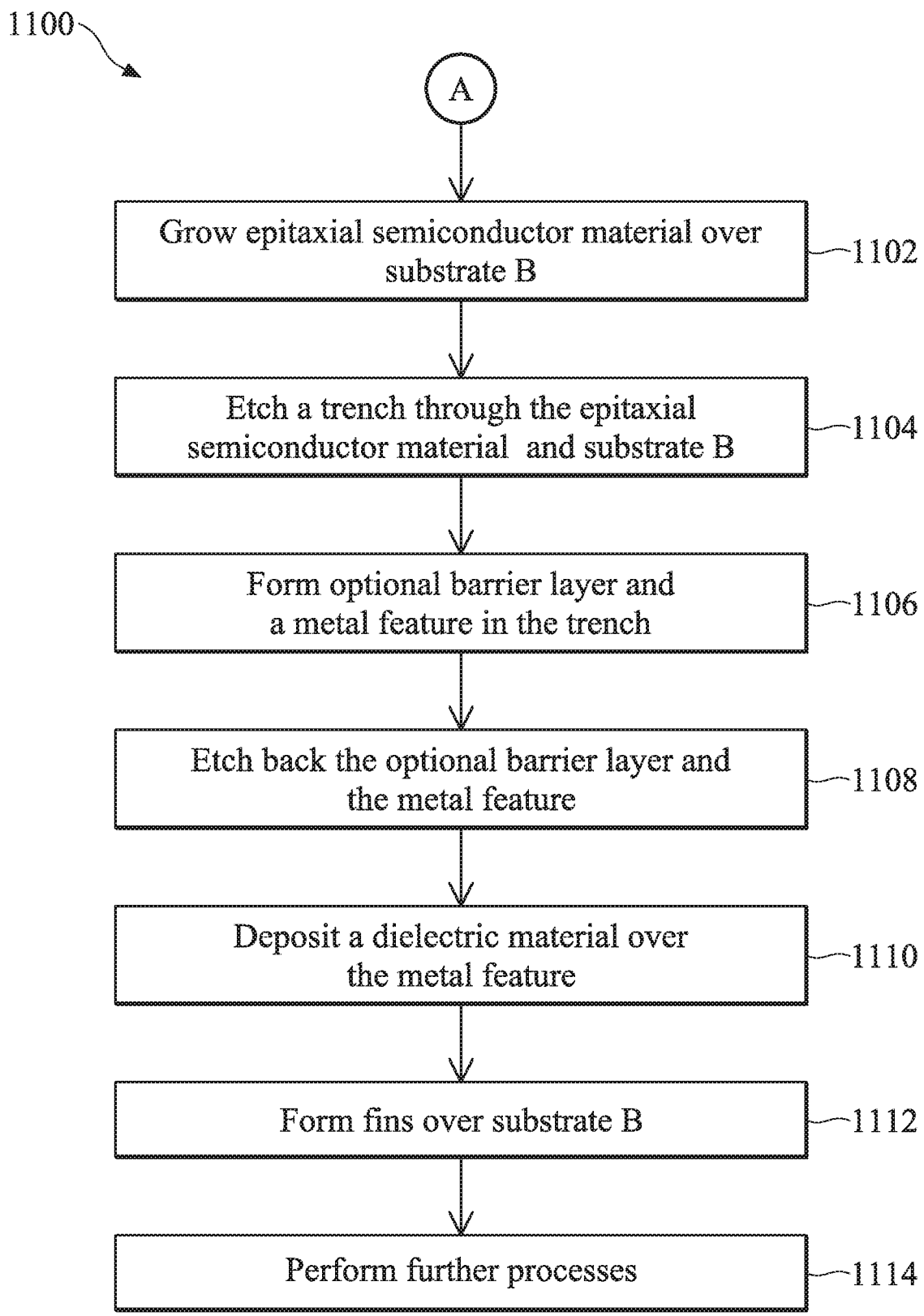
FIG. 11 illustrates a flow chart of a method for making a semiconductor device in accordance with an embodiment of the present disclosure.

Referring to FIG. 11, at operation 1102, the method 1100 continues the fabrication process by epitaxially growing a semiconductor material over the front surface of the substrate B. FIG. 12a shows the structure of the device 100 after the operation 1102 is performed in accordance with an embodiment. Referring to FIG. 12a, a semiconductor layer 222 is epitaxially grown on the semiconductor layer 220 using the semiconductor material of the layer 220 as the seed. The semiconductor layers 220 and 222 may comprise the same material or different materials. In an embodiment, both the semiconductor layers 220 and 222 comprise silicon crystal such as single crystalline silicon. In another embodiment, the semiconductor layer 220 comprises silicon crystal, and the semiconductor layer 222 comprises silicon germanium alloy ($Si_xGe_{1-x}$). In the present embodiment, the semiconductor layer 222 is part of the device layer 300.

Referring to FIG. 11, at operation 1104, the method 1100 etches one or more trenches 224 to expose the conductors 124 at the back side of the substrate 110. FIG. 12b shows the structure of the device 100 after the operation 1104 is performed in accordance with an embodiment. Referring to FIG. 12b, trench 224 penetrates through the semiconductor layer 222, the substrate 200, and the insulator 130, and exposes the conductors 124 in the substrate 110. The operation 1104 may include several steps. For example, it may form a hard mask layer over the semiconductor layer 222, form a photoresist layer over the hard mask layer, and pattern the photoresist layer using any of photolithography processes including double patterning processes. The photoresist layer is patterned to provide openings corresponding to the trenches 224. Subsequently, the hard mask layer and the various layers 222, 220, 210, and 130 are etched through the openings to form the trenches 224. Thereafter, the photoresist layer and the hard mask layer are removed. In an alternative embodiment, the photoresist layer may be formed directly on the semiconductor layer 222 without using the hard mask layer. Various other methods of performing the operation 1104 are possible and are contemplated.

Referring to FIG. 11, at operation 1106, the method 1100 forms the liner (or barrier) layer 232 on the surfaces of the trenches and forms the embedded conductors 230 over the liner layer 232. The liner layer 232 is optional, and in an alternative embodiment, the method 1100 forms the embedded conductors 230 directly on the surfaces of the trenches. FIG. 12c shows the structure of the device 100 after the operation 1106 is performed in accordance with an embodiment. Referring to FIG. 12c, the liner layer 232 is formed on the surfaces of the various layers 222, 220, 210, and 130 exposed in the trenches 224 (see FIG. 12b). The embedded conductor 230 is formed over the liner layer 232 and fills the remaining space of the trench 224. In this embodiment, the liner layer 232 is removed from the surface of the conductors 124, and the embedded conductor 230 directly contacts the conductors 124. In an alternative embodiment (such as shown in FIG. 2), the liner layer 232 is kept on the surface of the conductors 124 and interposes between the embedded conductor 230 and the conductors 124. The liner layer 232 may be formed using any process(es) suitable for depositing the dielectric material(s) thereof, such as atomic layer deposition (ALD) and chemical vapor deposition (CVD). The embedded conductor 230 may be formed using any process(es) suitable for depositing the metal material(s) thereof, such as CVD, physical vapor deposition (PVD), and plating.

Referring to FIG. 11, at operation 1108, the method 1100 partially etches back the embedded conductor 230 and the liner 232 to form a recess 226, as shown in FIG. 12d. The recess 226 may be the same size as or slightly bigger than the trench 224 from the top view. The operation 1108 may use an etching process that is selectively tuned to etch the embedded conductor 230 and the liner 232 without etching the semiconductor material 222. At operation 1110, the method 1100 (FIG. 11) deposits a dielectric material 234 in the recess 226, as shown in FIG. 12e. The dielectric material 234 may include silicon dioxide or other suitable dielectric material(s) and serve as a capping layer to protect the embedded conductor 230 from subsequent processes.

At operation 1112, the method 1100 (FIG. 11) forms active regions such as semiconductor fins 310 in the semiconductor layer 222, as shown in FIG. 12f. Also shown in FIG. 12f, the method 1100 forms patterned hard mask layer 314 over the fins 310 and a liner layer 318 on the sidewalls of the fins 310 as well as the upper surface of the semiconductor layer 220. The patterned mask 314 may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the semiconductor layer 222 and patterned using a photolithography process. Spacers are formed alongside the patterned sacrificial layer using a self-aligned process. The sacrificial layer is then removed, and the remaining spacers, or mandrels, become the patterned mask 314. The patterned mask 314 may include silicon oxide, silicon nitride, photoresist, or other suitable materials in various embodiments. The operation 1112 includes etching the semiconductor layer 222 using the patterned mask 314 as an etch mask, thereby forming the fins 310, and subsequently forming the liner layer 318. The liner layer 318 may include silicon nitride (e.g., $Si_3N_4$), and may be deposited using chemical vapor deposition (CVD) such as low-pressure CVD (LPCVD) or plasma-enhanced CVD (PECVD), atomic layer deposition (ALD), or other suitable methods.

At operation 1114, the method 1100 (FIG. 11) performs further processes to form the device 100. For example, the method 1100 may deposit isolation material 320 between the fins 310, form transistors in or on the semiconductor fins 310, form contacts, local interconnects, and upper interconnect layers. Particularly, the method 1100 forms local interconnects 330 and 340 (such as shown in FIG. 2) that connect the embedded conductor 230 to some of the source, drain, and gate electrodes of the transistors. The method 1100 demonstrates that the conductors 230 may be formed before semiconductors fins (or other types of active regions) are formed in the same device.

Figure 13:
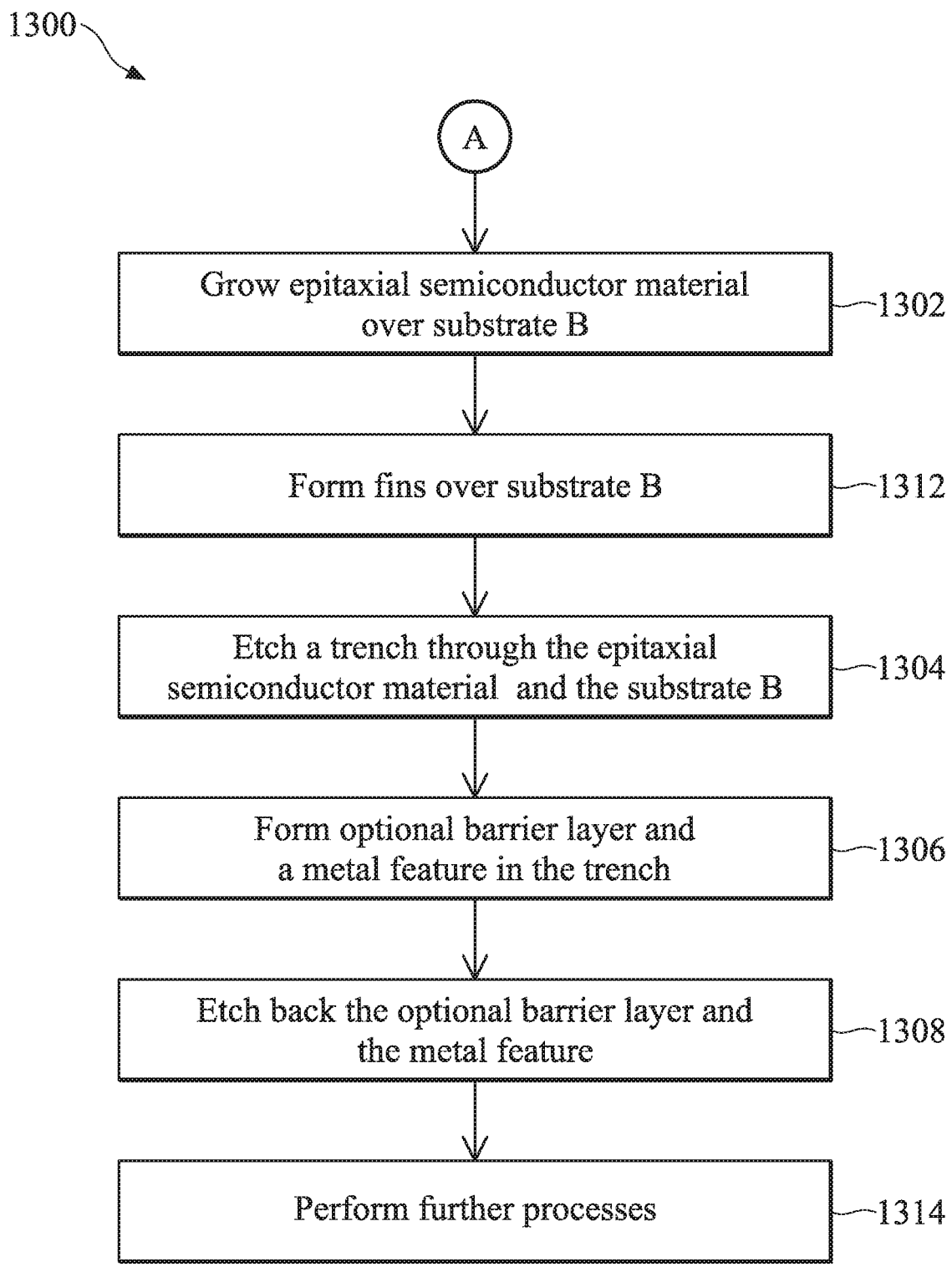
FIG. 13 illustrates a flow chart of a method for making a semiconductor device in accordance with an embodiment of the present disclosure.

FIG. 13 shows a flow chart of the method 1300 which is a variant of the method 1100. Referring to FIG. 13, the method 1300 includes operations 1302, 1304, 1306, 1308, 1312, and 1314 that are similar to the operations 1102, 1104, 1106, 1108, 1112, and 1114 respectively, described with reference to FIG. 11. One difference is that the method 1300 performs the operation 1312 (forming the fins) before the operation 1304 (etching trenches for embedded conductors). The method 1300 is briefly discussed below.

At operation 1302, the method 1300 epitaxially grows a semiconductor material over the front surface of the substrate B. This operation is similar to or the same as the operation 1102, and the resultant structure of the device 100 is shown in FIG. 12a.

Figure 14A:
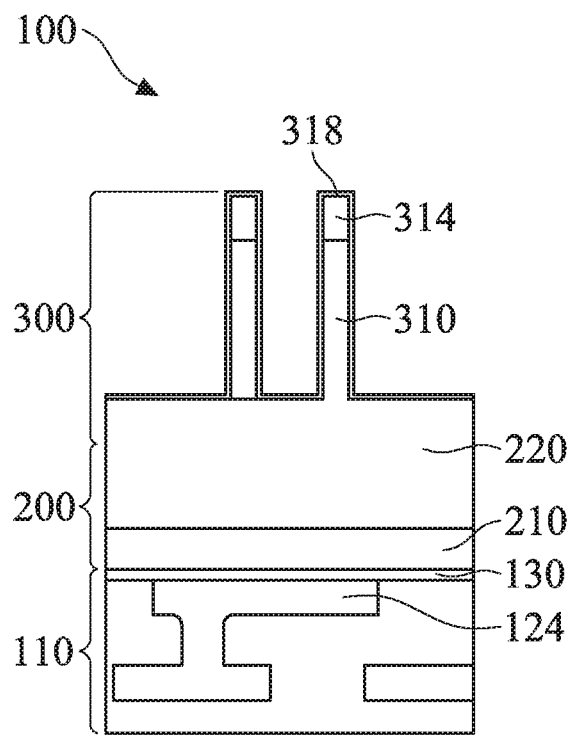
FIGS. 14a, 14b, 14c, and 14d illustrate cross-sectional views of a semiconductor device during fabrication according to an embodiment of the method shown in FIG. 13.

At operation 1312, the method 1300 forms fins 310, patterned hard mask layer 314, and liner layer 318, as shown in FIG. 14a. This operation is similar to or the same as the operation 1112.

Figure 14B:
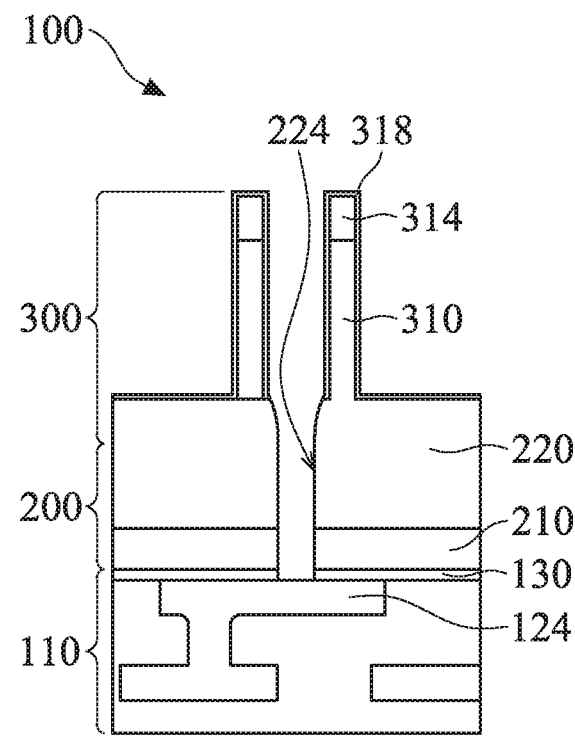

At operation 1304, the method 1300 forms trenches 224 to expose the conductors 124 at the back side of the substrate 110. This operation is similar to the operation 1104 with a difference that the fins 310 are present prior to the operation 1304. Particularly, the trenches 224 are formed between the fins 310. The operation 1304 includes photolithography and etching processes as discussed with reference to the operation 1104. The trench 224 is adjacent to the fins 310 as shown in FIG. 14b in the present embodiment. Alternatively, the trench 224 may be spaced away from the fins 310, such as shown in FIG. 1, in which the space occupied by the embedded conductor 230 corresponds to the trench 224.

Figure 14C:
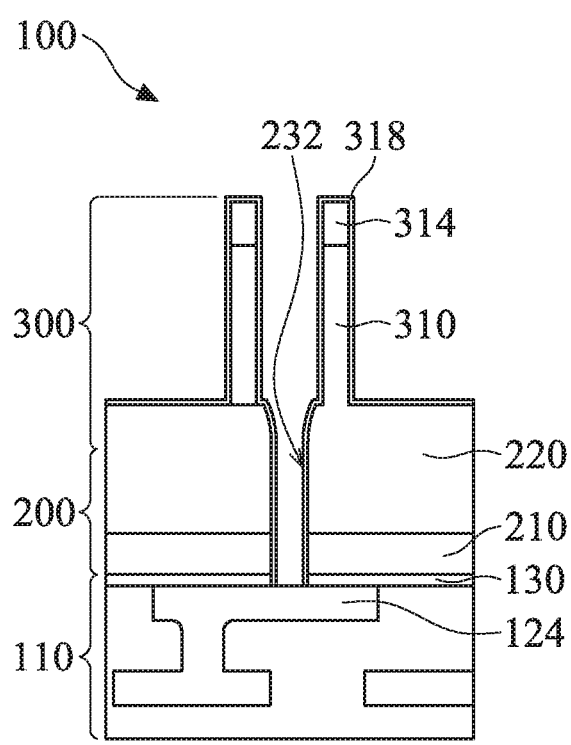
Figure 14D:
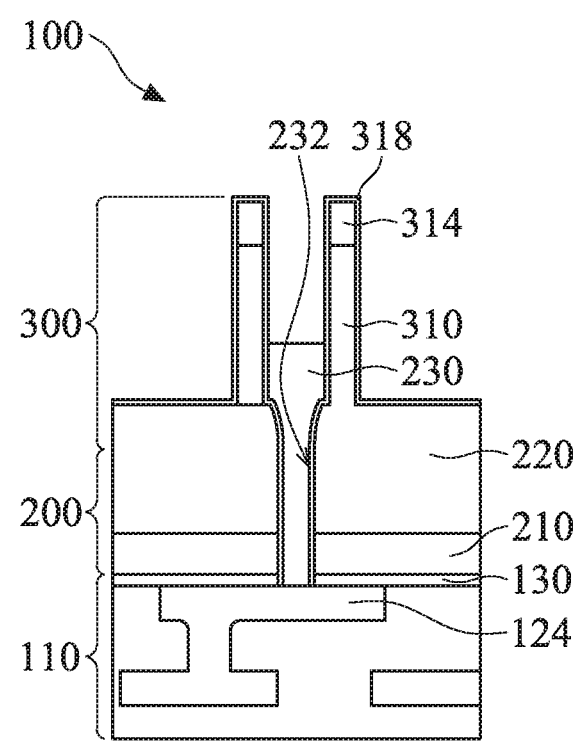

At operation 1306, the method 1300 forms the optional liner (or barrier) layer 232 on the surfaces of the trenches 224 (such as shown in FIG. 14c) and forms the embedded conductors 230 over the liner layer 232 (such as shown in FIG. 14d). This operation is similar to or the same as the operation 1106. At operation 1308, the method 1300 partially etches back the embedded conductor 230 and the liner 232. The operation 1308 may use an etching process that is selectively tuned to etch the embedded conductor 230 and the liner 232 without etching the liner layer 318.

At operation 1314, the method 1300 (FIG. 13) performs further processes to form the device 100. For example, the method 1300 may deposit isolation material 320 between the fins 310, form transistors in or on the semiconductor fins 310, form contacts, local interconnects, and upper interconnect layers. Particularly, the method 1300 forms local interconnects 330 and 340 (such as shown in FIG. 2) that connect the embedded conductor 230 to some of the source, drain, and gate electrodes of the transistors.

Figure 15:
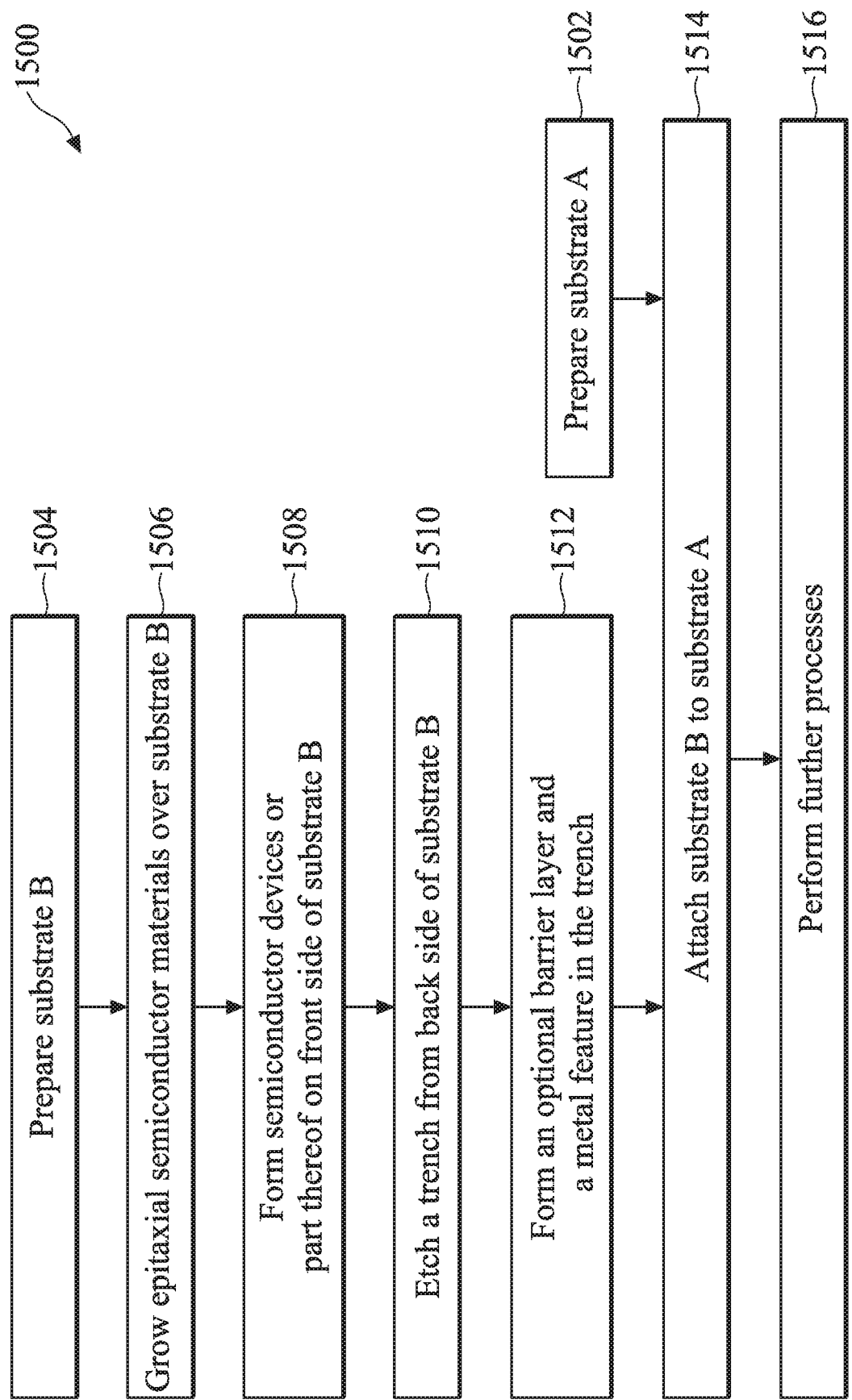
FIG. 15 illustrates a flow chart of a method for making a semiconductor device in accordance with an embodiment of the present disclosure.

FIG. 15 shows a flow chart of the method 1500. Referring to FIG. 15, the method 1500 includes operations 1502, 1504, 1506, 1508, 1510, 1512, 1514, and 1516. The method 1500 is briefly discussed below.

Figure 16A:
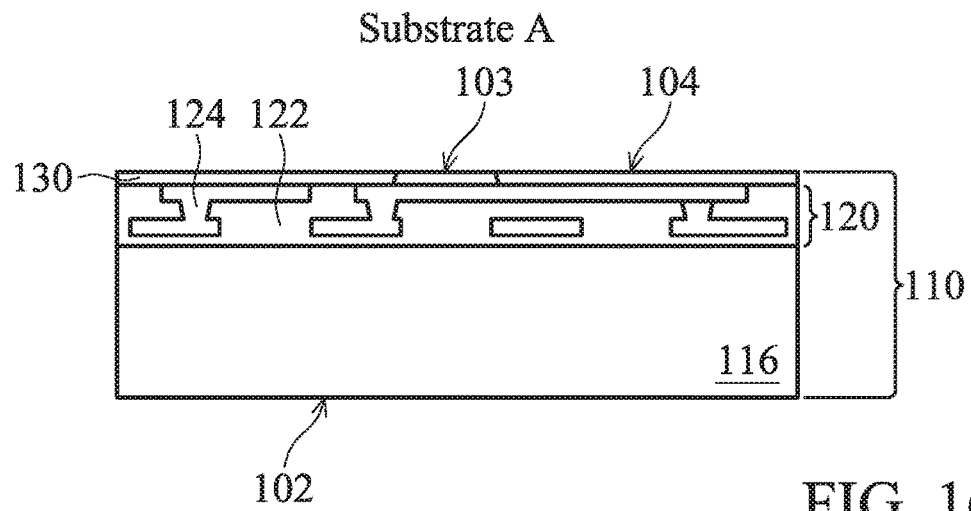
FIGS. 16a, 16b, 16c, 16d, 16e, 16f, and 16g illustrate cross-sectional views of a semiconductor device during fabrication according to an embodiment of the method shown in FIG. 15.

Referring to FIG. 15, at operation 1502, the method 1500 prepares a substrate A to be included in the semiconductor device 100. This is similar to the operation 902 described above. For example, the substrate A may be an embodiment of the substrate 110 as shown in FIGS. 2-8. The following description refers to substrate A also as the substrate 110. Referring to FIG. 16a, the substrate 110 has a front side (pointed to by the reference 102) and a back side (pointed to by the reference 104). The substrate 110 includes a semiconductor layer 116, a redistribution layer 120, and an insulator 130. The redistribution layer 120 includes one or more dielectric layers 122 and conductors 124. Portions 103 of the conductors 124 are used for making connections with embedded conductors 230 (see FIGS. 16f and 16g) described later.

Figure 16B:
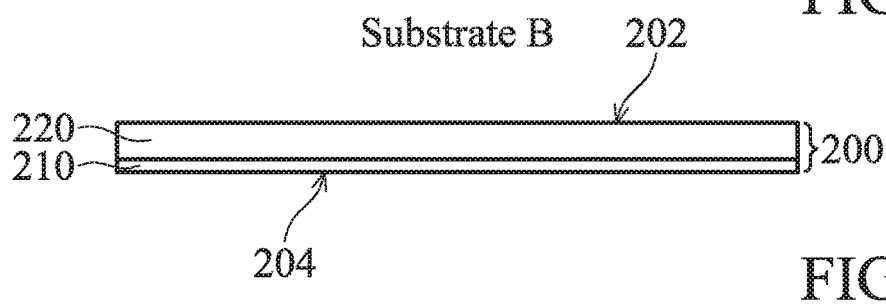

At operation 1504, the method 1500 (FIG. 15) prepares a substrate B to be included in the semiconductor device 100. For example, the substrate B may be an embodiment of the substrate 200 as shown in FIGS. 2-8. The following description refers to substrate B also as the substrate 200. As shown in FIG. 16b, the substrate 200 has a front side (pointed to by the reference 202) and a back side (pointed to by the reference 204). The substrate 200 includes a semiconductor layer 220 and an insulator 210 (such as an oxide).

Figure 16C:
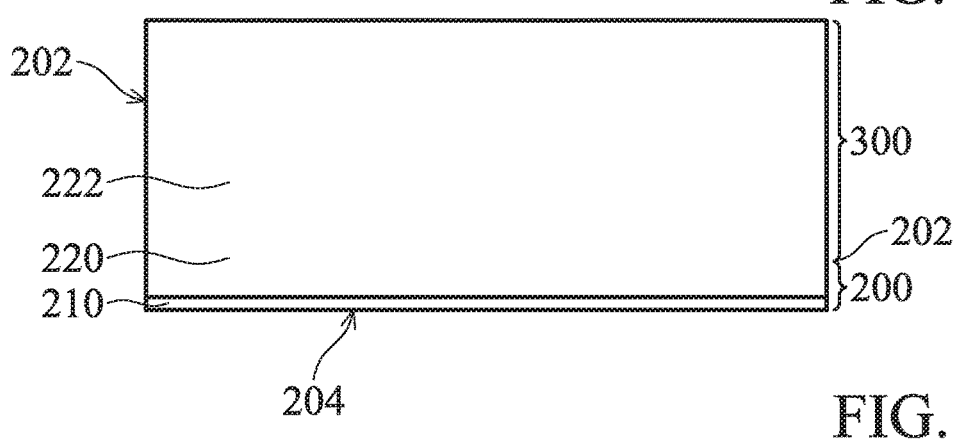

At operation 1506, the method 1500 (FIG. 15) grows a semiconductor material over the front side of the substrate 200, similar to the operation 1102 described above. Referring to FIG. 16c, a semiconductor layer 222 is epitaxially grown on the semiconductor layer 220 using the semiconductor material of the layer 220 as the seed. The semiconductor layers 220 and 222 may comprise the same material or different materials, as discussed above with reference to FIG. 12a.

Figure 16D:
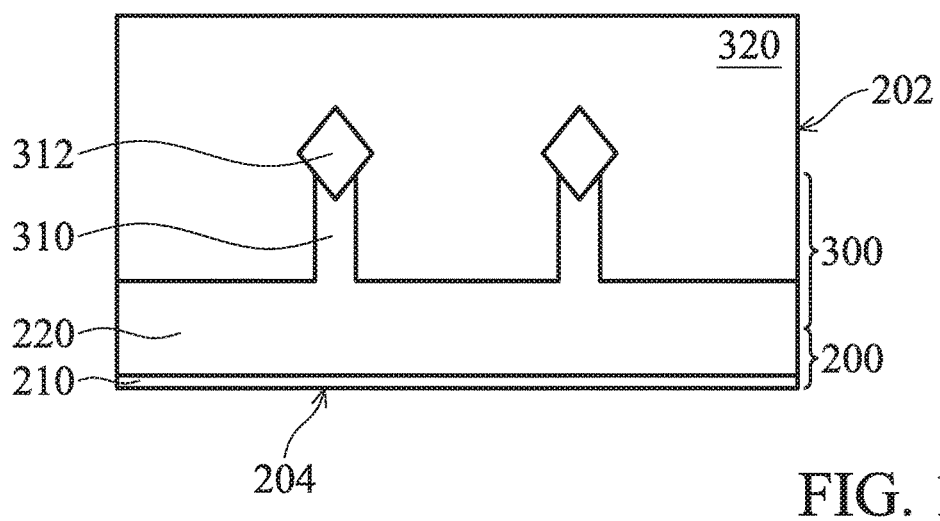

At operation 1508, the method 1500 (FIG. 15) forms semiconductor devices or part thereof over the front side of the substrate 200. Referring to FIG. 16*d*, in this embodiment, operation 1508 forms fins 310, epitaxial features 312 which may be source or drain electrodes of transistors, and isolation material 320. Operation 1508 may also form gate electrodes (e.g., high-k metal gates). Operation 1508 may also form nano-wire and/or nano-sheet structures in place of or in addition to fins 310. In an embodiment, operation 1508 finishes any and all high temperature processes that might adversely affect embedded conductors 230 (FIGS. 16*f* and 16*g*) to be formed later.

Figure 16E:
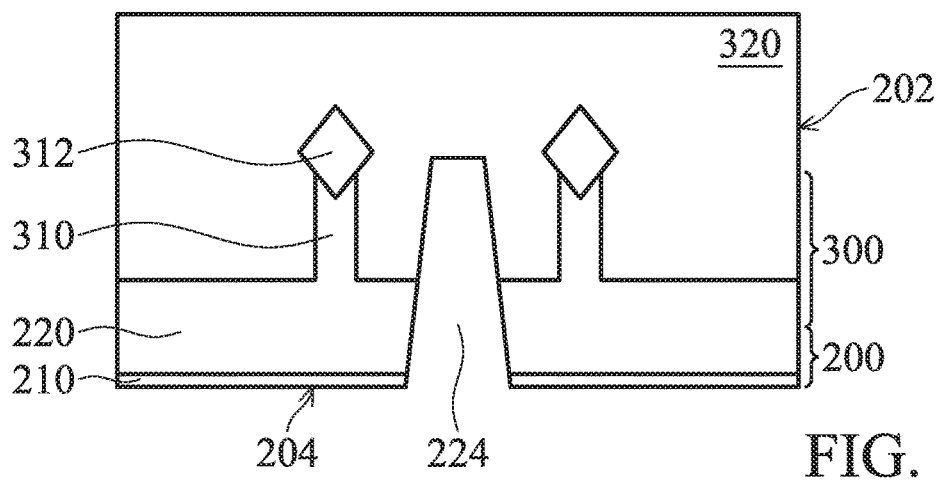

At operation 1510, the method 1500 (FIG. 15) etches one or more trenches 224 from the back side of the substrate 200. Refer to FIG. 16*e*, a trench 224 is etched through the insulator 210, the semiconductor layer 220, and into the device layer 300. This is similar to the operation 1104 except that operation 1510 etches the trench 224 from the back side of the substrate. In an embodiment where conductors (such as conductors 330 and 340 in FIG. 2, although not shown in FIG. 16*e*) are already formed in the device layer 300, the trench 224 may expose the conductors so that the embedded conductors 230 (FIG. 16*f*) may be formed to electrically contact such conductors.

Figure 16F:
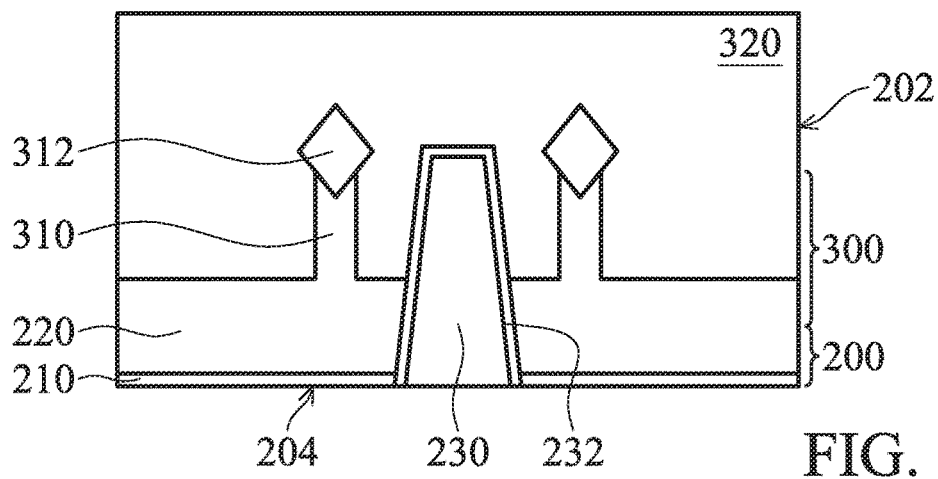

At operation 1512, the method 1500 (FIG. 15) forms the optional liner (or barrier) layer 232 on the surfaces of the trenches 224 and forms the embedded conductors 230 over the liner layer 232. This is similar to the operation 1106. FIG. 16*f* shows the structure of the device 100 after the operation 1512 is performed in accordance with an embodiment.

Figure 16G:
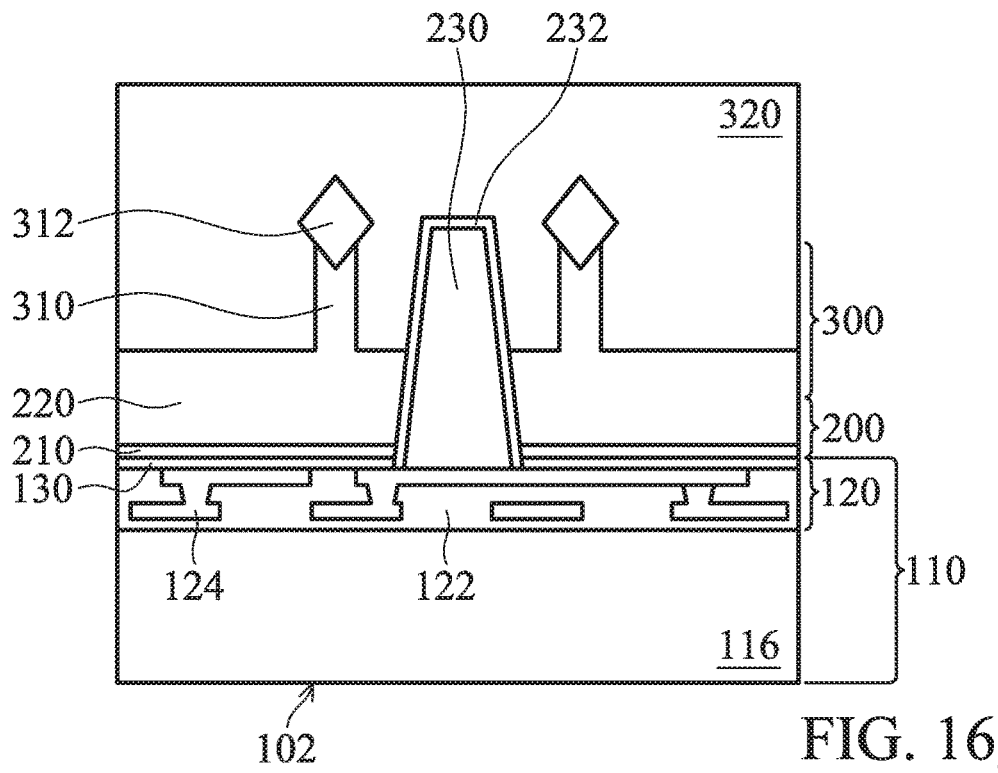

At operation 1514, the method 1500 (FIG. 15) attaches the substrates A and B together. Referring to FIG. 16*g*, in the present embodiment, the method 1500 attaches the back side of the substrate B to the back side of the substrate A. Particularly, the embedded conductors 230 are bonded to electrically contact the conductors 124. The operation 1514 may use any suitable bonding processes, such as direct bonding or hybrid bonding.

At operation 1516, the method 1500 (FIG. 15) performs further processes to form the device 100. For example, the method 1500 may form contacts, local interconnects, and upper interconnect layers.

Figure 17:
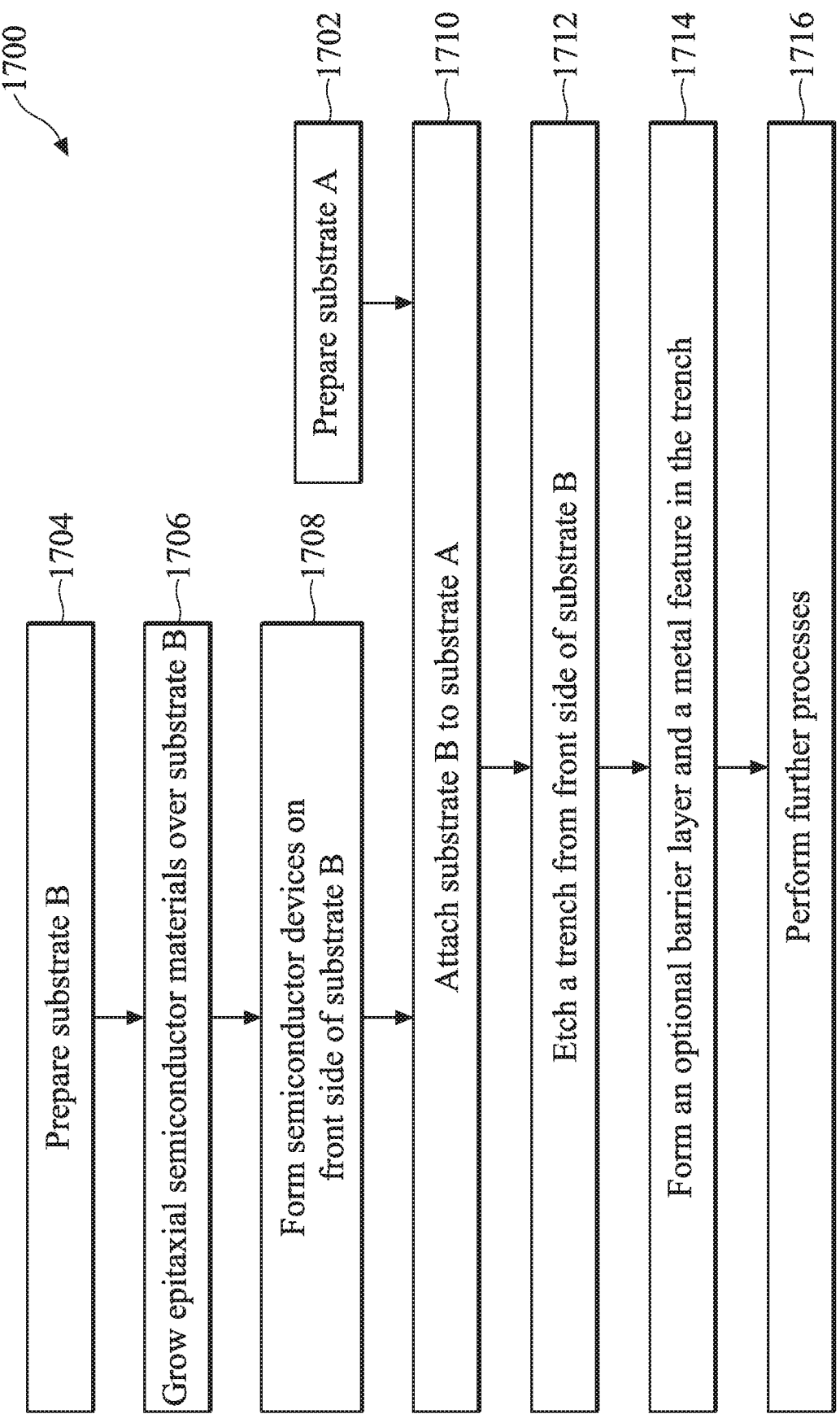
FIG. 17 illustrates a flow chart of a method for making a semiconductor device in accordance with an embodiment of the present disclosure.

FIG. 17 shows a flow chart of the method 1700. Referring to FIG. 17, the method 1700 includes operations 1702, 1704, 1706, 1708, 1710, 1712, 1714, and 1716. Operations 1702, 1704, 1706, and 1708 are similar to operations 1502, 1504, 1506, and 1508, respectively. The structures resulted from the operations 1702, 1704, 1706, and 1708 are shown in FIGS. 18*a*, 18*b*, 18*c*, and 18*d*, respectively and are similar to the structures shown in FIGS. 16*a*, 16*b*, 16*c*, and 16*d*, respectively. The descriptions of them are omitted for brevity.

Figure 18A:
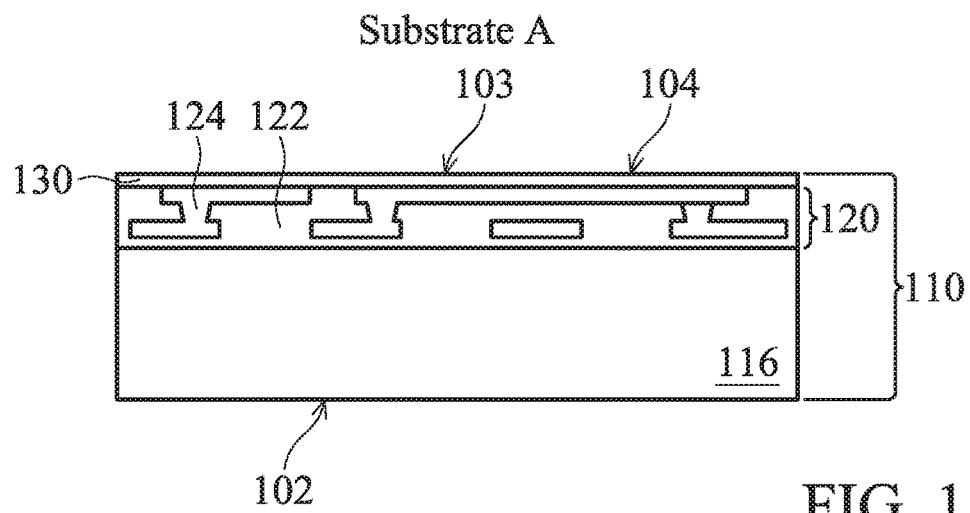
FIGS. 18a, 18b, 18c, 18d, 18e, 18f, and 18g illustrate cross-sectional views of a semiconductor device during fabrication according to an embodiment of the method shown in FIG. 17.
Figure 18B:
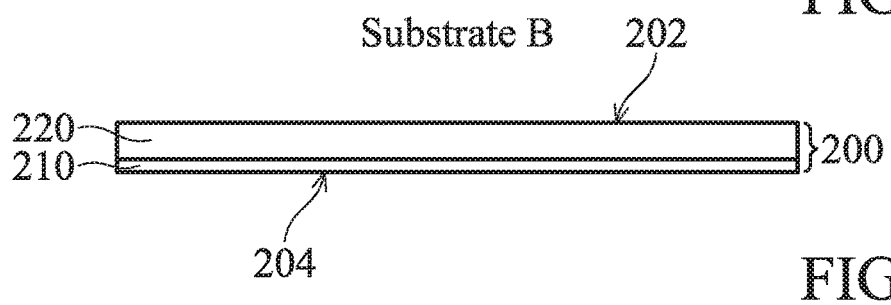
Figure 18C:
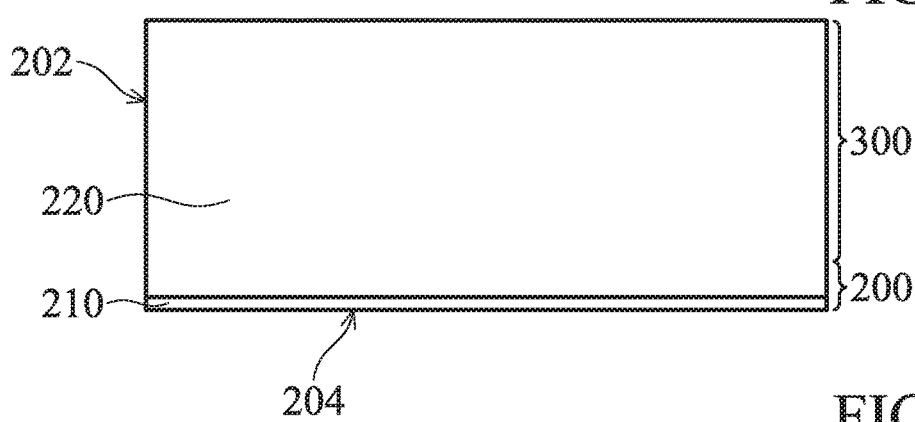
Figure 18D:
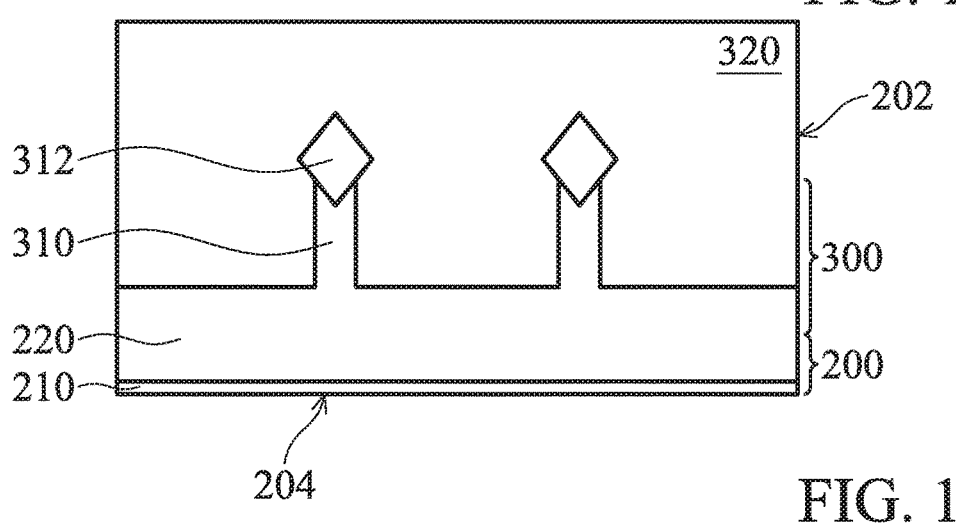
Figure 18E:
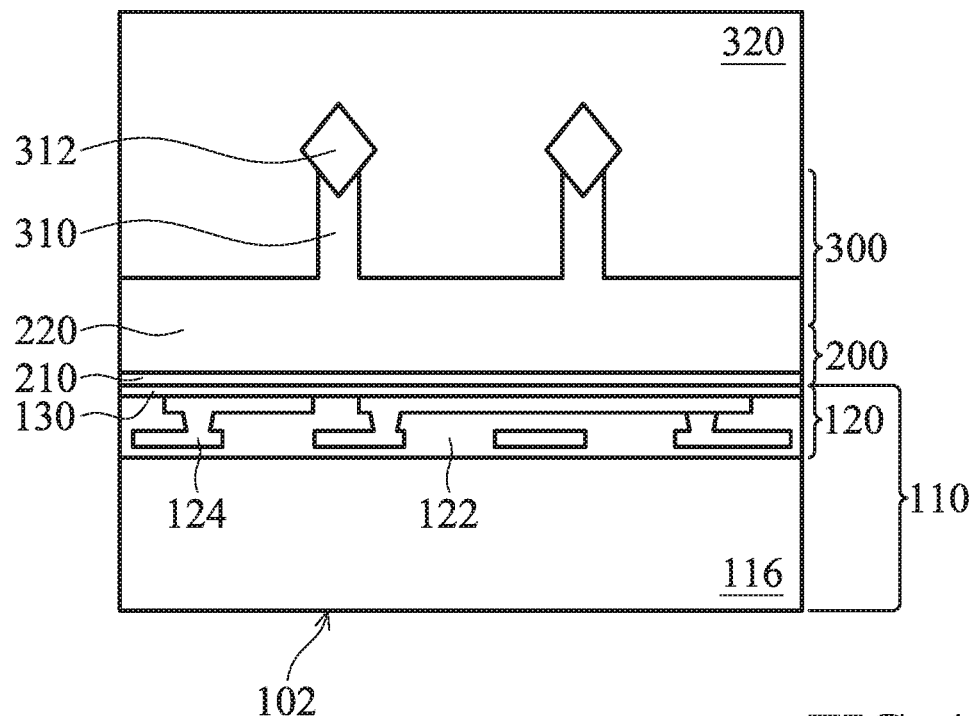

At operation 1710, the method 1700 (FIG. 17) attaches the substrates A and B together. Referring to FIG. 18*e*, in the present embodiment, the method 1700 attaches the back side of the substrate B to the back side of the substrate A. The operation 1710 may use any suitable bonding processes, such as direct bonding or hybrid bonding.

Figure 18F:
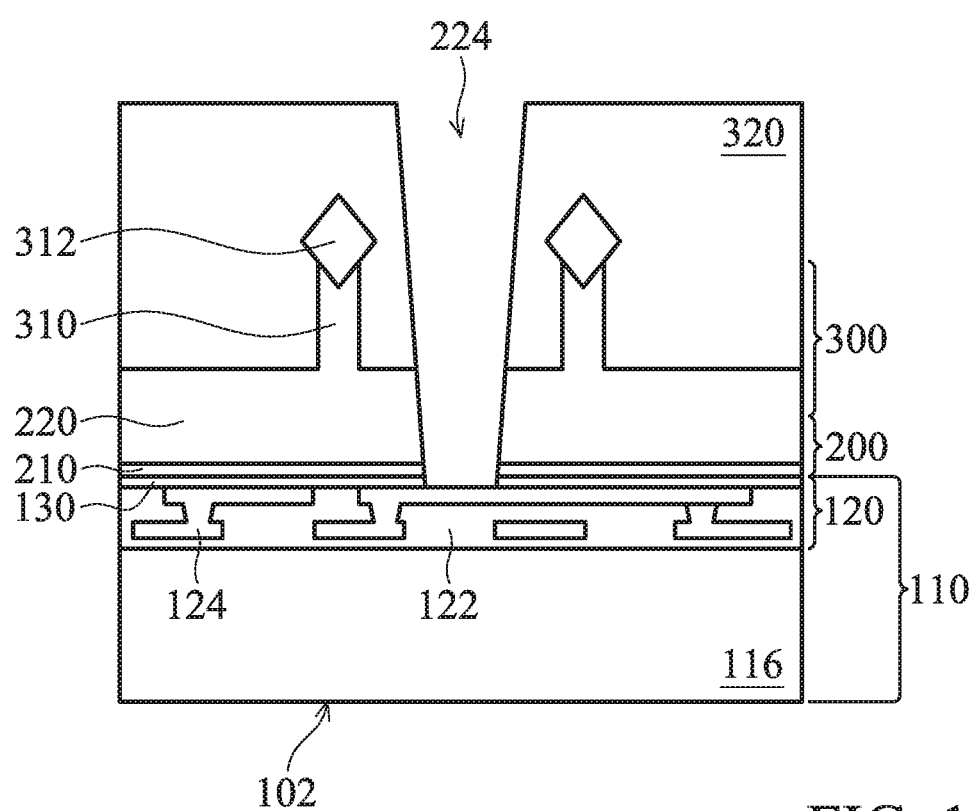
Figure 18G:
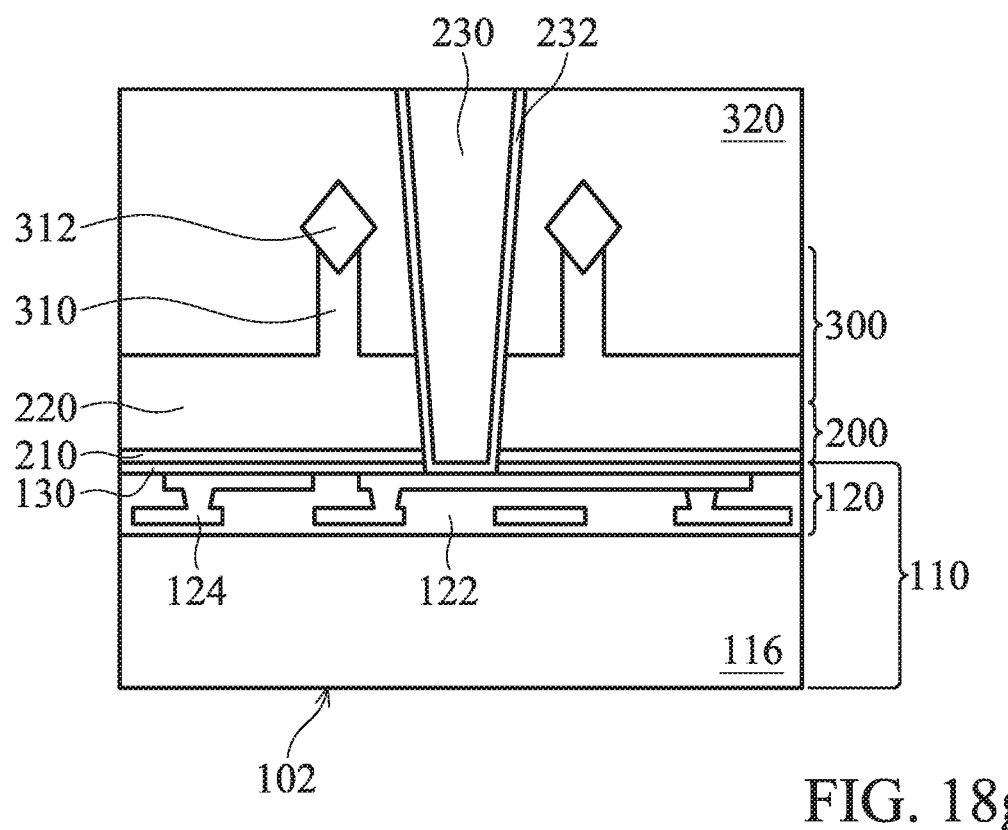

At operation 1712, the method 1700 (FIG. 17) etches one or more trenches 224 from the front side of the substrate 200. Refer to FIG. 18*f*, a trench 224 is etched through the device layer 300, the semiconductor layer 220, and the insulator 210, exposing the conductors 124. This is similar to the operation 1104.

At operation 1714, the method 1700 (FIG. 17) forms the optional liner (or barrier) layer 232 on the surfaces of the trenches 224 and forms the embedded conductors 230 over the liner layer 232. This is similar to the operation 1106. FIG. 16*f* shows the structure of the device 100 after the operation 1714 is performed in accordance with an embodiment. The embedded conductors 230 electrically contact the conductors 124.

At operation 1716, the method 1700 (FIG. 17) performs further processes to form the device 100. For example, the method 1700 may form contacts, local interconnects, and upper interconnect layers. Particularly, the method 1700 forms connections to the embedded conductors 230.

Although not intended to be limiting, one or more embodiments of the present disclosure provide many benefits to a semiconductor device and the formation thereof. For example, embodiments of the present disclosure provide a device having embedded conductors going through a substrate which can be a bulk substrate or an SOI substrate. Particularly, the embedded conductors are underneath transistors of the device or at the same level as the transistors. The embedded conductors provide extra routing resources to the device, reduce IR drop on power rails, reduce power consumption, and enable further device scaling and integration. In some embodiment, the embedded conductors minimize temperature and/or mechanical stress and increase production yield.

In one exemplary aspect, the present disclosure is directed to a structure that includes a first substrate and a second substrate. The first substrate has a front side and a back side. The second substrate has a front side and a back side. The back side of the second substrate is attached to the back side of the first substrate. The structure further includes a device layer over the front side of the second substrate; a first conductor going through a semiconductor layer in the second substrate; and a conductive connection that connects the first conductor to a conductive feature in the device layer.

In an embodiment of the structure, the first substrate includes a redistribution layer at the back side of the first substrate. The redistribution layer includes a second conductor embedded in a dielectric layer. The first conductor contacts the second conductor.

In an embodiment of the structure, the first conductor is connected to a power rail or a ground plane of the structure. In another embodiment of the structure, the first conductor extends above the frond side of the second substrate.

In an embodiment, the structure further includes a semiconductor fin extending above the front side of the second substrate, wherein a top surface of the first conductor is lower than a top surface of the semiconductor fin.

In an embodiment of the structure, the first conductor includes tungsten, ruthenium, rhodium, iridium, molybdenum, chromium, or a combination thereof. In another embodiment of the structure, the first conductor includes copper, gold, silver, palladium, osmium, platinum, or a combination thereof.

In an embodiment, the structure further includes a liner layer between the first conductors and the second substrate. In another embodiment, the structure further includes an interconnect layer over the front side of the second substrate and over the device layer. In yet another embodiment, the structure further includes a redistribution layer over the front side of the first substrate, wherein the one of the first conductors is electrically connected to the redistribution layer.

In another exemplary aspect, the present disclosure is directed to a structure that includes a first substrate having a front side and a back side and a second substrate having a front side and a back side, wherein the back side of the second substrate is bonded to the back side of the first substrate. The structure further includes a metal feature extending from the back side of the first substrate to the front side of the second substrate; a device layer over the front side of the second substrate and over the metal feature; and a multilayer interconnect over the device layer.

In an embodiment of the structure, the first substrate includes a redistribution layer at the back side of the first substrate, and the metal feature is electrically connected to the redistribution layer.

In an embodiment, the structure further includes a connector that electrically connects the metal feature to a source, drain, or gate electrode in the device layer.

In an embodiment of the structure, the second substrate includes a layer of semiconductor material at the front side of the second substrate, and the metal feature extends through the layer of semiconductor material.

In another embodiment of the structure, the second substrate includes one or more layers of insulator extending from the front side of the second substrate to the back side of the second substrate.

In yet another exemplary aspect, the present disclosure is directed to a method. The method includes receiving a first substrate having a front side and a back side, the front side of the first substrate having a semiconductor material, the back side of the first substrate having a passivation layer; receiving a second substrate having a front side and a back side, the back side of the second substrate having an insulator; attaching the back side of the first substrate to the back side of the second substrate; etching a trench through the second substrate and through the passivation layer; and forming a conductor in the trench.

In an embodiment, the method further includes removing a portion of the second substrate after the attaching and before the etching of the trench. In another embodiment, the method further includes forming semiconductor fins over the front side of the second substrate after the attaching. In a further embodiment, the forming of the semiconductor fins is performed after the forming of the conductor. In another further embodiment, the forming of the semiconductor fins is performed before the etching of the trench.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a first substrate having a front side and a back side;
   a second substrate having a front side and a back side, wherein the back side of the second substrate is attached to the back side of the first substrate;
   a device layer over the front side of the second substrate;
   a first conductor going through a semiconductor layer in the second substrate;
   a conductive connection that connects the first conductor to a conductive feature in the device layer; and
   a semiconductor fin extending above the front side of the second substrate, wherein a top surface of the first conductor is lower than a top surface of the semiconductor fin.

2. The structure of claim 1, wherein the first substrate includes a redistribution layer at the back side of the first substrate, and the redistribution layer includes a second conductor embedded in a dielectric layer, wherein the first conductor contacts the second conductor.

3. The structure of claim 1, wherein the first conductor is connected to a power rail or a ground plane of the structure.

4. The structure of claim 1, wherein the first conductor extends above the frond side of the second substrate.

5. The structure of claim 1, wherein the first conductor includes tungsten, ruthenium, rhodium, iridium, molybdenum, chromium, or a combination thereof.

6. The structure of claim 1, wherein the first conductor includes copper, gold, silver, palladium, osmium, platinum, or a combination thereof.

7. The structure of claim 1, further comprising a liner layer between the first conductor and the second substrate.

8. The structure of claim 1, further comprising an interconnect layer over the front side of the second substrate and over the device layer.

9. The structure of claim 1, further comprising a redistribution layer over the front side of the first substrate such that the first substrate is sandwiched between the redistribution layer and the second substrate, wherein the first conductor is electrically connected to the redistribution layer.

10. A structure, comprising:
    a first substrate having a front side and a back side;
    a second substrate having a front side and a back side, wherein the back side of the second substrate is bonded to the back side of the first substrate, wherein the second substrate includes a layer of semiconductor material at the front side of the second substrate;
    a metal feature extending from the back side of the first substrate to the front side of the second substrate;
    a liner layer surrounding the metal feature, wherein the layer of semiconductor material is in direct contact with left and right sides of the liner layer,
    a device layer over the front side of the second substrate and over the metal feature; and
    a multilayer interconnect over the device layer.

11. The structure of claim 10, wherein the first substrate includes a redistribution layer at the back side of the first substrate, and the metal feature is electrically connected to the redistribution layer.

12. The structure of claim 10, further comprising:
    a connector that electrically connects the metal feature to a source, drain, or gate electrode in the device layer.

13. The structure of claim 10, wherein the metal feature extends through the layer of semiconductor material.

14. The structure of claim 10, wherein the second substrate includes one or more layers of insulator extending from the front side of the second substrate to the back side of the second substrate.

15. A structure, comprising:
    a first substrate having a front side and a back side, wherein the first substrate includes a first redistribution layer at the back side of the first substrate, a second redistribution layer at the front side of the first substrate, and a first semiconductor layer sandwiched between the first and the second redistribution layers;
    a second substrate having a front side and a back side, wherein the back side of the second substrate is bonded to the back side of the first substrate;

a device layer over the front side of the second substrate; and a first conductor going through a second semiconductor layer in the second substrate and extending into the device layer, wherein the first conductor contacts a second conductor in the first redistribution layer.

16. The structure of claim 15, further comprising:

a third conductor that connects the first conductor to a conductive feature in the device layer.

17. The structure of claim 16, wherein the conductive feature includes a source or drain electrode of a transistor.

18. The structure of claim 15, further comprising a semiconductor fin extending above the front side of the second substrate, wherein a top surface of the first conductor is lower than a top surface of the semiconductor fin.

19. The structure of claim 15, wherein the first conductor is connected to a power rail or a ground plane.

20. The structure of claim 15, wherein the first conductor has a T-shaped cross-sectional profile.

* * * * *